(12) United States Patent  (10) Patent No.: US 9,293,220 B2
Chung                      (45) Date of Patent: *Mar. 22, 2016

(54) LOW-PIN-COUNT NON-VOLATILE MEMORY INTERFACE FOR 3D IC

(71) Applicant: Shine C. Chung, San Jose, CA (US)

(72) Inventor: Shine C. Chung, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/636,155

(22) Filed: Mar. 2, 2015

(65) Prior Publication Data
US 2015/0170759 A1     Jun. 18, 2015

Related U.S. Application Data

(63) Continuation of application No. 14/493,069, filed on Sep. 22, 2014, which is a continuation-in-part of application No. 13/288,843, filed on Nov. 3, 2011, now Pat. No. 8,988,965, and a continuation-in-part of (Continued)

(51) Int. Cl.
G11C 17/18      (2006.01)
G11C 17/16      (2006.01)
G11C 29/00      (2006.01)
G11C 8/18       (2006.01)
G11C 16/10      (2006.01)
G11C 29/02      (2006.01)
(Continued)

(52) U.S. Cl.
CPC   *G11C 17/16* (2013.01); *G11C 8/18* (2013.01); *G11C 16/10* (2013.01); *G11C 29/028* (2013.01); *G11C 29/78* (2013.01); *G11C 16/16* (2013.01); *G11C 16/26* (2013.01); *G11C 16/32* (2013.01); *G11C 2029/4402* (2013.01); *G11C 2216/30* (2013.01)

(58) Field of Classification Search
CPC ........ G11C 18/00; G11C 16/10; G11C 16/26; G11C 29/12; G11C 8/18
See application file for complete search history.

(56) References Cited

U.S. PATENT DOCUMENTS 3,198,670 A   8/1965   Nissim
3,715,242 A   2/1973   Daniel
(Continued)

FOREIGN PATENT DOCUMENTS

CN   1469473 A    1/2004
CN   1691204 A   11/2005
(Continued)

OTHER PUBLICATIONS

U.S. Appl. No. 13/471,704, filed May 15, 2012.
(Continued)

*Primary Examiner* — Hien Nguyen

(57) ABSTRACT

A low-pin-count non-volatile (NVM) memory to be provided in an integrated circuit for a 3D IC to repair defects, trim devices, or adjust parameters is presented here. At least one die in a 3D IC can be built with at least one low-pin-count OTP memory. The low-pin-count OTP memory can be built with a serial interface such as I2C-like or SPI-like of interface. The pins of the low-pin-count OTP in at least one die can be coupled together to have only one set of low-pin-count bus for external access. With proper device ID, each die in a 3D IC can be accessed individually for soft programming, programming, erasing, or reading. This technique can improve the manufacture yield, device, circuit, or logic performance or to store configuration parameters for customization after 3D IC are built.

22 Claims, 25 Drawing Sheets

Related U.S. Application Data application No. 13/571,797, filed on Aug. 10, 2012, now Pat. No. 8,913,449, and a continuation-in-part of application No. 14/231,404, filed on Mar. 31, 2014, which is a continuation-in-part of application No. 13/288,843, filed on Nov. 3, 2011, now Pat. No. 8,988,965.

(60) Provisional application No. 61/880,917, filed on Sep. 21, 2013, provisional application No. 61/409,539, filed on Nov. 3, 2010, provisional application No. 61/668,031, filed on Jul. 5, 2012, provisional application No. 61/609,353, filed on Mar. 11, 2012, provisional application No. 61/409,539, filed on Nov. 3, 2010.

(51) Int. Cl.
| | | |
|---|---|---|
| G11C 16/16 | (2006.01) | |
| G11C 16/26 | (2006.01) | |
| G11C 16/32 | (2006.01) | |
| G11C 29/44 | (2006.01) | |

(56) References Cited

U.S. PATENT DOCUMENTS

| | | |
|---|---|---|
| 4,148,046 A | 4/1979 | Hendrickson et al. |
| 4,192,059 A | 3/1980 | Khan et al. |
| 4,642,674 A | 2/1987 | Schoofs |
| 5,192,989 A | 3/1993 | Matsushita et al. |
| 5,389,552 A | 2/1995 | Iranmanesh |
| 5,447,876 A | 9/1995 | Moyer et al. |
| 5,635,742 A | 6/1997 | Hoshi et al. |
| 5,637,901 A | 6/1997 | Beigel et al. |
| 5,723,890 A | 3/1998 | Fujihira et al. |
| 5,757,046 A | 5/1998 | Fujihira et al. |
| 5,761,148 A | 6/1998 | Allan et al. |
| 5,962,903 A | 10/1999 | Sung et al. |
| 6,002,156 A | 12/1999 | Lin |
| 6,008,092 A | 12/1999 | Gould |
| 6,034,882 A | 3/2000 | Johnson et al. |
| 6,054,344 A | 4/2000 | Liang et al. |
| 6,140,687 A | 10/2000 | Shimomura et al. |
| 6,243,864 B1 | 6/2001 | Odani et al. |
| 6,249,472 B1 | 6/2001 | Tamura et al. |
| 6,346,727 B1 | 2/2002 | Ohtomo |
| 6,388,292 B1 | 5/2002 | Lin |
| 6,400,540 B1 | 6/2002 | Chang |
| 6,405,160 B1 | 6/2002 | Djaja et al. |
| 6,461,934 B2 | 10/2002 | Nishida et al. |
| 6,483,734 B1 | 11/2002 | Sharma et al. |
| 6,597,629 B1 | 7/2003 | Raszka et al. |
| 6,611,043 B2 | 8/2003 | Takiguchi |
| 6,731,535 B1 | 5/2004 | Ooishi et al. |
| 6,770,953 B2 | 8/2004 | Boeck et al. |
| 6,803,804 B2 | 10/2004 | Madurawe |
| 6,813,705 B2 | 11/2004 | Duesterwald et al. |
| 6,944,083 B2 | 9/2005 | Pedlow |
| 6,967,879 B2 | 11/2005 | Mizukoshi |
| 7,009,182 B2 | 3/2006 | Kannan et al. |
| 7,211,843 B2 | 5/2007 | Low et al. |
| 7,212,432 B2 | 5/2007 | Ferrant et al. |
| 7,224,598 B2 | 5/2007 | Perner |
| 7,263,027 B2 | 8/2007 | Kim et al. |
| 7,294,542 B2 | 11/2007 | Okushima |
| 7,391,064 B1 | 6/2008 | Tripsas et al. |
| 7,411,844 B2 | 8/2008 | Nitzan et al. |
| 7,439,608 B2 | 10/2008 | Arendt |
| 7,461,371 B2 | 12/2008 | Luo et al. |
| 7,573,762 B2 | 8/2009 | Kenkare et al. |
| 7,589,367 B2 | 9/2009 | Oh et al. |
| 7,660,181 B2 | 2/2010 | Kumar et al. |
| 7,696,017 B1 | 4/2010 | Tripsas et al. |
| 7,701,038 B2 | 4/2010 | Chen et al. |
| 7,764,532 B2 | 7/2010 | Kurjanowicz et al. |
| 7,802,057 B2 | 9/2010 | Iyer et al. |
| 7,808,815 B2 | 10/2010 | Ro et al. |
| 7,830,697 B2 | 11/2010 | Herner |
| 7,833,823 B2 | 11/2010 | Klersy |
| 7,859,920 B2 | 12/2010 | Jung |
| 7,889,204 B2 | 2/2011 | Hansen et al. |
| 7,910,999 B2 | 3/2011 | Lee et al. |
| 8,008,723 B2 | 8/2011 | Nagai |
| 8,050,129 B2 | 11/2011 | Liu et al. |
| 8,089,137 B2 | 1/2012 | Lung et al. |
| 8,115,280 B2 | 2/2012 | Chen et al. |
| 8,119,048 B2 | 2/2012 | Nishimura |
| 8,168,538 B2 | 5/2012 | Chen et al. |
| 8,174,063 B2 | 5/2012 | Liu et al. |
| 8,174,922 B2 | 5/2012 | Naritake |
| 8,179,711 B2 | 5/2012 | Kim et al. |
| 8,183,665 B2 | 5/2012 | Bertin et al. |
| 8,217,490 B2 | 7/2012 | Bertin et al. |
| 8,233,316 B2 | 7/2012 | Liu et al. |
| 8,339,079 B2 | 12/2012 | Tamada |
| 8,369,166 B2 | 2/2013 | Kurjanowicz et al. |
| 8,373,254 B2 | 2/2013 | Chen et al. |
| 8,380,768 B2 | 2/2013 | Hoefler |
| 8,415,764 B2 | 4/2013 | Chung |
| 8,482,972 B2 | 7/2013 | Chung |
| 8,488,359 B2 | 7/2013 | Chung |
| 8,488,364 B2 | 7/2013 | Chung |
| 8,514,606 B2 | 8/2013 | Chung |
| 8,526,254 B2 | 9/2013 | Kurjanowicz et al. |
| 8,559,208 B2 | 10/2013 | Chung |
| 8,570,800 B2 | 10/2013 | Chung |
| 8,576,602 B2 | 11/2013 | Chung |
| 8,643,085 B2 | 2/2014 | Pfirsch |
| 8,644,049 B2 | 2/2014 | Chung |
| 8,648,349 B2 | 2/2014 | Masuda et al. |
| 8,649,203 B2 | 2/2014 | Chung |
| 8,699,259 B2 | 4/2014 | Zhang et al. |
| 8,760,904 B2 | 6/2014 | Chung |
| 8,817,563 B2 | 8/2014 | Chung |
| 8,830,720 B2 | 9/2014 | Chung |
| 8,848,423 B2 | 9/2014 | Chung |
| 8,854,859 B2 | 10/2014 | Chung |
| 8,861,249 B2 | 10/2014 | Chung |
| 8,913,415 B2 | 12/2014 | Chung |
| 8,913,449 B2 | 12/2014 | Chung |
| 8,923,085 B2 | 12/2014 | Chung |
| 8,988,965 B2 | 3/2015 | Chung |
| 9,019,742 B2 | 4/2015 | Chung |
| 9,019,791 B2 | 4/2015 | Chung |
| 9,025,357 B2 | 5/2015 | Chung |
| 9,070,437 B2 | 6/2015 | Chung |
| 2002/0168821 A1 | 11/2002 | Williams et al. |
| 2002/0196659 A1 | 12/2002 | Hurst et al. |
| 2003/0104860 A1 | 6/2003 | Cannon et al. |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2004/0130924 A1 | 7/2004 | Ma et al. |
| 2005/0060500 A1 | 3/2005 | Luo et al. |
| 2005/0062110 A1 | 3/2005 | Dietz et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2005/0242386 A1 | 11/2005 | Ang |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansal et al. |
| 2006/0215440 A1 | 9/2006 | Cho et al. |
| 2006/0244099 A1 | 11/2006 | Kurjanowicz |
| 2007/0004160 A1 | 1/2007 | Voldman |
| 2007/0057323 A1 | 3/2007 | Furukawa et al. |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0223266 A1 | 9/2007 | Chen |
| 2007/0279978 A1 | 12/2007 | Ho et al. |
| 2008/0025068 A1 | 1/2008 | Scheuerlein et al. |

(56) References Cited

U.S. PATENT DOCUMENTS

| | | |
|---|---|---|
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 | 5/2008 | Ohara |
| 2008/0151612 A1 | 6/2008 | Pellizzer et al. |
| 2008/0170429 A1 | 7/2008 | Bertin et al. |
| 2008/0175060 A1 | 7/2008 | Lie et al. |
| 2008/0220560 A1 | 9/2008 | Klersy |
| 2008/0225567 A1 | 9/2008 | Burr et al. |
| 2008/0280401 A1 | 11/2008 | Burr et al. |
| 2009/0055617 A1 | 2/2009 | Bansal et al. |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0309089 A1 | 12/2009 | Hsia et al. |
| 2010/0027326 A1 | 2/2010 | Kim et al. |
| 2010/0085798 A1 | 4/2010 | Lu et al. |
| 2010/0091546 A1 | 4/2010 | Liu et al. |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0232203 A1 | 9/2010 | Chung et al. |
| 2010/0238701 A1 | 9/2010 | Tsukamoto et al. |
| 2010/0246237 A1 | 9/2010 | Borot et al. |
| 2010/0277967 A1 | 11/2010 | Lee et al. |
| 2010/0301304 A1 | 12/2010 | Chen et al. |
| 2011/0022648 A1 | 1/2011 | Harris et al. |
| 2011/0062557 A1 | 3/2011 | Bandyopadhyay et al. |
| 2011/0128772 A1 | 6/2011 | Kim et al. |
| 2011/0145777 A1 | 6/2011 | Iyer et al. |
| 2011/0175199 A1 | 7/2011 | Lin et al. |
| 2011/0222330 A1 | 9/2011 | Lee et al. |
| 2011/0260289 A1 | 10/2011 | Oyamada |
| 2011/0297912 A1 | 12/2011 | Samachisa et al. |
| 2011/0310655 A1 | 12/2011 | Kreupl et al. |
| 2011/0312166 A1 | 12/2011 | Yedinak et al. |
| 2012/0032303 A1 | 2/2012 | Elkareh et al. |
| 2012/0039107 A1 | 2/2012 | Chung |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0256292 A1 | 10/2012 | Yu et al. |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0161780 A1 | 6/2013 | Kizilyalli et al. |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0208526 A1 | 8/2013 | Chung |
| 2013/0215663 A1 | 8/2013 | Chung |
| 2013/0235644 A1 | 9/2013 | Chung |
| 2013/0268526 A1 | 10/2013 | Johns et al. |
| 2013/0308366 A1 | 11/2013 | Chung |
| 2014/0010032 A1 | 1/2014 | Seshadri et al. |
| 2014/0016394 A1 | 1/2014 | Chung et al. |
| 2014/0071726 A1 | 3/2014 | Chung |
| 2014/0092674 A1 | 4/2014 | Chung |
| 2014/0124871 A1 | 5/2014 | Ko et al. |
| 2014/0124895 A1 | 5/2014 | Salzman et al. |
| 2014/0126266 A1 | 5/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0160830 A1 | 6/2014 | Chung |
| 2014/0211567 A1 | 7/2014 | Chung |
| 2014/0269135 A1 | 9/2014 | Chung |
| 2014/0340954 A1 | 11/2014 | Chung |
| 2015/0003142 A1 | 1/2015 | Chung |
| 2015/0003143 A1 | 1/2015 | Chung |
| 2015/0009743 A1* | 1/2015 | Chung ............... 365/96 |
| 2015/0014785 A1 | 1/2015 | Chung |
| 2015/0021543 A1 | 1/2015 | Chung |
| 2015/0029777 A1 | 1/2015 | Chung |
| 2015/0078060 A1 | 3/2015 | Chung |

FOREIGN PATENT DOCUMENTS

| | | |
|---|---|---|
| CN | 101083227 | A | 5/2007 |
| CN | 101057330 | A | 10/2007 |
| CN | 101188140 | A | 5/2008 |
| CN | 101271881 | A | 9/2008 |
| CN | 101483062 | A | 7/2009 |
| CN | 101728412 | A | 6/2010 |
| EP | 1367596 | A1 | 12/2003 |
| JP | 03-264814 | | 11/1991 |
| TW | I309081 | | 4/2009 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.

(56) References Cited

OTHER PUBLICATIONS

Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.

Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.

Aziz, A. et al., "Lateral Polysilicon n+p Diodes: Effect of the Grain boundaries and of the p-Implemented Doping Level on the I-V and C-V Characteristics," Springer Proceedings in Physics, vol. 54, 1991, pp. 318-322.

Aziz, A. et al., "Lateral Polysilicon PN Diodes: Current-Voltage Characteristics Simulation Between 200K and 400K a Numerical Approach," IEEE Trans. on Elec. Dev., vol. 41, No. 2, Feb. 1994, pp. 204-211.

Banerjee, Kaustav et al., "High Current Effects in Salicide Films for Sub-0.25um VLSI Technologies," IEEE 36th IRPS, 1998, pp. 284-292.

Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.

Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.

Bedeschi, F. et al., "A Fully Symmetrical Sense Amplifier for Nonvolatile Memories," IEEE. Int. Symp. on Circuits and Systems, (ISCAS), vol. 2, 2004, pp. 625-628.

Bedeschi, F. et al., "An 8Mb Demonstrator for High-Density 1.8V Phase-Change Memories," VLIS Cir. Symp, Jun. 2004, pp. 442-445.

Bedeschi, F. et al., "SET and RESET Pulse Characterization in BJT-Selected Phase-Change Memory," IEEE Int. Symp. on Circuits and Systems (ISCAS), 2005, pp. 1270-1273.

Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.

Cagli, C. et al., "Evidence for threshold switching in the set process of NiO-based RRAM and physical modeling for set, reset, retention and disturb prediction," IEEE IEDM, 2008, pp. 1-4.

Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008, pp. 861-864.

Chan, Wan Tim, et al., "CMOS Compatible Zero-Mask One Time Programmable Memory Design", Master Thesis, Hong-Kong University of Science and Technologies, 2008.

Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.

Cheng, Yu-Hsing et al., "Failure Analysis and Optimization of Metal Fuses for Post Package Trimming," IEEE 45th IRPS, 2007, pp. 616-617.

Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.

Cho, Woo Yeong et al., "A 0.18um 3.0V 64Mb Non-Volatile Phase-Transition Random-Access Memory (PRAM)," ISSCC, Feb. 2004, Sec. 2-1.

Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.

Choi, Youngdon et al., "A 20nm 1.8V 8Gb PRAM with 40MB/s Program Bandwidth," IEEE ISSCC, 2012, pp. 46-47.

Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.

Chung, S. et al., "A 512×8 Electrical Fuse Memory with 15um2 Cells Using 8-sq Asymmetrical Fuse and Core Devices in 90nm CMOS," VLSI Cir. Symp., Jun. 2007, pp. 74-75.

Crowley, Matthew et al., "512Mb PROM with 8 Layers of Antifuse/Diode Cells," IEEE ISSCC 2003, Sec. 16.4.

De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.

De Sandre, Guido et al., "A 90nm 4Mb Embedded Phase-Change Memory with 1.2V 12ns Read Access Time and 1MB/s Write Throughput," ISSCC 2010, Sec. 14.7.

Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.

Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.

Dion, Michael J., "Reservoir Modeling for Electromigration Improvement of Metal Systems with Refractory Barriers," IEEE 39th IRPS, 2001, pp. 327-333.

Doorn, T. S. et al., "Ultra-fast Programming of Silicided Polysilicon Fuses Based on New Insights in the Programming Physics," IEEE IEDM, 2005, pp. 667-670.

Doom, T. S., "Detailed Qualitative Model for the Programming Physics of Silicided Polysilicon Fuses," IEEE Trans. on Elec. Dev. vol. 54, No. 12, Dec. 2007, pp. 3285-3291.

Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.

Engel, B. et al., "The Science and Technology of Magnetoresistive Tunneling Memory," IEEE Tran. on Nanotechnology, vol. 1, No. 1, Mar. 2002, pp. 32-38.

Engel, B.N. et al., "A 4Mb Toggle MRAM Based on a Novel bit and Switching Method," IEEE Trans. on Mag. vol. 41, No. 1, Jan. 2005, pp. 132-136.

Fellner, Johannes, et al., "Lifetime Study for a Poly Fuse in a 0.35um Polycide CMOS Process," IEEE 43rd IRPS, 2005, pp. 446-449.

Gao, B. et al., "Oxide-Based RRAM: Uniformity Improvement Using a New Material-Oriented Methodology," IEEE VLSI Tech. Symp., Jun. 2009, pp. 30-31.

Gao, B. et al., "Oxide-Based RRAM Switching Mechanism: A New Ion-Transport-Recombination Model," IEDM, Dec. 2008, pp. 563-566.

Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.

Gogl, D. et al., "A 16-Mb MRAM Featuring Bootstrapped Write Drivers," IEEE J. of Solid-State Circuits, vol. 40, No. 4, Apr. 2005, pp. 902-908.

Gopalan, C. et al., Demonstration of Conductive Bridging Random Access Memory (CBRAM) in Logic CMOS Process, IEEE Int. Memory Workshop, 2010, pp. 1-4.

Ha, Daewon and Kim, Kinam, "Recent Advances in High Density Phase Change Memory (PRAM)," IEEE VLSI Tech. Symp. Jun. 2007.

Hosoi, Y. et al., "High Speed Unipolar Switching Resistance RAM (RRAM) Technology," IEEE IEDM, Dec. 2006, pp. 1-4.

Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.

Huang, Chia-En et al., "A New CMOS Logic Anti-Fuse Cell with Programmable Contact," IEEE IEDM Tech. Dig. 2007, pp. 48-51.

Im, Jay et al., "Characterization of Silicided Polysilicon Fuse Implemented in 65nm CMOS Technology,"7th Annual Non-Volatile Memory Technology Symp, (NVMTS) 2006, pp. 55-57.

Jin, Li-Yan et al., "Low-Area 1-Kb Multi-Bit OTP IP Design," IEEE 8th Int. Conf. on ASIC (ASICON), 2009. pp. 629-632.

Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.

Kalnitsy, Alexander et al., "CoSi2 Integrated Fuses on Poly Silicon for Low Voltage 0.18um CMOS Applications," IEEE IEDM 1999, pp. 765-768.

(56) References Cited

OTHER PUBLICATIONS

Kang, Han-Byul et al., "Electromigration of NiSi Poly Gated Electrical Fuse and Its Resistance Behaviors Induced by High Temperature," IEEE IRPS, 2010, pp. 265-270.
Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.
Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.
Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.
Ker, Ming-Dou et al., "Ultra-High-Voltage Charge Pump Circuit in Low-Voltage Bulk CMOS Processes With Polysilicon Diodes," IEEE Trans. on Cir. and Sys.-II: Exp. Brief., vol. 54, No. 1, Jan. 2007, pp. 47-51.
Kim, Deok-Kee et al., "An Investigation of Electrical Current Induced Phase Transitions in the NiPtSi/Polysilicon System," J. App. Phy. 103, 073708 (2008).
Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.
Kim, Jinbong et al., "3-Transistor Antifuse OTP ROM Array Using Standard CMOS Process," IEEE VLSI Cir. Symposium, Jun. 2003, pp. 239-242.
Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate CMOS," IEEE J. of Sol. Stat. Cir, vol., 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.
Lai, S., "Current Status of the Phase Change Memory and Its Future," IEEE IEDM Dig. of Tech. Paper, Dec. 2003, pp. 255-258.
Lee, H. Y. et al., "Low Power and High Speed Bipolar Switching with a Thin Reactive Ti Buffer Layer in Robust HfO2 Based RRAM," IEEE IEDM, 2008, pp. 1-4.
Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.
Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.
Lee, M.-J. et al., "Stack Friendly all-Oxide 3D RRAM Using GaInZnO Peripheral TFT Realized Over Glass Substrates," IEDM, Dec. 2008. pp. 1-4.
Lee, Man Chiu et al., "OTP Memory for Low Cost Passive RFID Tags," IEEE Conf. on Electron Devices and Solid-State Circuits (EDSSC), 2007, pp. 633-636.
Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.
Lim, Kyunam et al., "Bit Line Coupling Scheme and Electrical Fuse Circuit for Reliable Operation of High Density DRAM," IEEE VLSI Cir. Symp. Jun. 2001, pp. 33-34.
Maffitt, T. et al., "Design Considerations for MRAM," IBM J. Res. & Dev., vol. 50, No. 1, Jan. 2006, pp. 25-39.
Meng, X.Z. et al., "Reliability Concept for Electrical Fuses," IEE Proc.-Sci Meas. Technol., vol. 144, No. 2, Mar. 1997, pp. 87-92.
Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.
Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.
Morimoto, T. et al., "A NiSi Salicide Technology for Advanced Logic Devices," IEEE IEDM, Dec. 1991, pp. 653-656.
Neale, Ron, "PCM Progress Report No. 6 Afterthoughts," http://www.eetimes.com/General/PrintView/4236240, Feb. 13, 2012, 5 pages.
Nebashi, R. et al., "A 90nm 12ns 32Mb 2T1MTJ MRAM," IEEE ISSCC Dig. of Tech. Paper, Sess. 27.4, Feb. 2009, 3 pages.
Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.
Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.
Oh, G. H. et al., "Parallel Multi-Confined (PMC) Cell Technology for High Density MLC PRAM," IEEE VLSI Tech. Symp., Jun. 2009, pp. 220-221.
Oh, J. H. et al., "Full Integration of Highly Manufacturable 512Mb PRAM Based on 90nm Technology," IEEE IEDM Dig. of Tech. Paper, Dec. 2006, pp. 1-4.
Osada, K. et al., "Phase Change RAM Operated with 1.5V CMOS as Low Cost Embedded Memory," IEEE CICC, Nov. 2005, pp. 431-434.
Park, Don et al., "Study on Reliability of Metal Fuse for Sub-100nm Technology," IEEE Int. Symp. on Semiconductor Manufacturing (ISSM), 2005, pp. 420-421.
Park, Jongwoo et al., "Phase Transformation of Programmed NiSi Electrical Fuse: Diffusion, Agglomeration, and Thermal Stability," 18th IEEE Int. Symp. on Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.
Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.
Rizzolo, R. F. et al., "IBM System z9 eFUSE applications and methodology," IBM J. Res. & Dev. vol. 51 No. ½ Jan./Mar. 2007, pp. 65-75.
Robson, Norm et al., "Electrically Programmable Fuse (eFuse) from Memory Redundancy to Autonomic Chips," IEEE CICC, 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.

(56) References Cited

OTHER PUBLICATIONS

Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.
Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.
Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/ 94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technology Conference (IITC), 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 mailed Sep. 18, 2012.
Office Action for U.S. Appl. No. 13/471,704 mailed Jul. 31, 2012.
Notice of Allowance for U.S. Appl. No. 13/471,704 mailed Oct. 18, 2012.
Notice of Allowance for U.S. Appl. No. 13/026,678 mailed Sep. 19, 2012.
Office Action for U.S. Appl. No. 13/026,783 mailed Sep. 27, 2012.
Office Action for U.S. Appl. No. 13/026,717 mailed Oct. 25, 2012.
Office Action for U.S. Appl. No. 13/026,650 mailed Nov. 9, 2012.
Office Action for U.S. Appl. No. 13/026,692 mailed Nov. 9, 2012.
Office Action for U.S. Appl. No. 13/026,752 mailed Nov. 9, 2012.
Office Action for U.S. Appl. No. 13/026,656 mailed Nov. 13, 2012.
Office Action for U.S. Appl. No. 13/026,704 mailed Nov. 23, 2012.
Office Action for U.S. Appl. No. 13/397,673, mailed Dec. 18, 2012.
Office Action for U.S. Appl. No. 13/026,840, mailed Dec. 31, 2012.
Office Action for U.S. Appl. No. 13/026,852, mailed Jan. 14, 2013.
Office Action for U.S. Appl. No. 13/026,783, mailed Sep. 27, 2012.
Restriction Requirement for U.S. Appl. No. 13/026,835, mailed Dec. 12, 2012.
Notice of Allowance for U.S. Appl. No. 13/026,717, mailed Feb. 12, 2013.
Office Action for U.S. Appl. No. 13/471,704, mailed Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, mailed Feb. 20, 2013.
Notice of Allowance for U.S. Appl. No. 13/026,783, mailed Mar. 4, 2013.
Notice of Allowance for U.S. Appl. No. 13/026,692, mailed Mar. 15, 2013.
Office Action for U.S. Appl. No. 13/026,704, mailed Nov. 23, 2012.
Notice of Allowance for U.S. Appl. No. 13/026,835, mailed Mar. 20, 2013.
Notice of Allowance for U.S. Appl. No. 13/026,664, mailed Apr. 22, 2013.
Notice of Allowance for U.S. Appl. No. 13/026,656, mailed Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, Mailed Apr. 18, 2013.
Notice of Allowance for U.S. Appl. No. 13/026,704, mailed Apr. 30, 2013.
Notice of Allowance for U.S. Appl. No. 13/026,852, mailed May 10, 2013.
Notice of Allowance for U.S. Appl. No. 13/026,717, mailed May 15, 2013.

(56) References Cited

OTHER PUBLICATIONS

Notice of Allowance for U.S. Appl. No. 13/471,704, mailed May 22, 2013.
Notice of Allowance for U.S. Appl. No. 13/026,678, mailed May 28, 2013.
Notice of Allowance for U.S. Appl. No. 13/026,650, mailed May 30, 2013.
Restriction Requirement for U.S. Appl. No. 13/314,444, mailed Jun. 7, 2013.
Restriction Requirement for U.S. Appl. No. 13/214,198, mailed Jun. 13, 2013.
Notice of Allowance for U.S. Appl. No. 13/026,840, mailed Jun. 13, 2013.
Restriction Requirement for U.S. Appl. No. 13/026,771, mailed Jun. 13, 2013.
Notice of Allowance for U.S. Appl. No. 13/026,752, mailed Jul. 1, 2013.
Restriction Requirement for U.S. Appl. No. 13/678,543, mailed Jul. 8, 2013.
Office Action for U.S. Appl. No. 13/026,725, mailed Jul. 19, 2013.
Notice of Allowance for U.S. Appl. No. 13/026,664, mailed Jul. 22, 2013.
Notice of Allowance for U.S. Appl. No. 13/026,692, mailed Jul. 23, 2013.
Notice of Allowance for U.S. Appl. No. 13/397,673, mailed Jul. 30, 2013.
Notice of Allowance for U.S. Appl. No. 13/026,704, mailed Aug. 2, 2013.
Notice of Allowance for U.S. Appl. No. 13/026,783, mailed Aug. 5, 2013.
Office Action for U.S. Appl. No. 13/214,198, mailed Aug. 6, 2013.
Office action for Chinese Patent Application No. 201110279954.7, mailed Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, mailed Sep. 9, 2013.
Office Action for U.S. Appl. No. 13/314,444, mailed Sep. 9, 2013.
Office Action for U.S. Appl. No. 13/026,771, mailed Sep. 9, 2013.
Notice of Allowance for U.S. Appl. No. 13/026,852, mailed Sep. 18, 2013.
Office Action (Ex Parte) for U.S. Appl. No. 13/678,543, mailed Sep. 20, 2013.
Office Action for U.S. Appl. No. 13/835,308, mailed Sep. 27, 2013.
Notice of Allowance for U.S. Appl. No. 13/026,717, mailed Oct. 1, 2013.
Office Action for U.S. Appl. No. 13/954,831, mailed Oct. 1, 2013.
Notice of Allowance for U.S. Appl. No. 13/026,656, mailed Oct. 4, 2013.
Office Action for U.S. Appl. No. 13/214,183, mailed Oct. 25, 2013.
Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, mailed Nov. 15, 2013.
Notice of Allowance for U.S. Appl. No. 13/026,835, mailed Nov. 22, 2013.
Notice of Allowance for U.S. Appl. No. 13/026,725, mailed Dec. 10, 2013.
Office Action for U.S. Appl. No. 13/026,783, mailed Dec. 23, 2013.
Notice of Allowance for U.S. Appl. No. 13/026,771, mailed Jan. 15, 2014.
Office Action for Chinese Patent Application No. 201110244362.1, mailed Sep. 29, 2013.
Office Action for Chinese Patent Application No. 201110235464.7, mailed Oct. 8, 2013.
Office Action for Chinese Patent Application No. 201110244400.3, mailed Nov. 5, 2013.
Office Action for Chinese Patent Application No. 201110244342.4, mailed Oct. 31, 2013.
Restriction Requirement for U.S. Appl. No. 13/678,541, mailed Feb. 28, 2014.
Notice of Allowance for U.S. Appl. No. 13/026,840, mailed Mar. 6, 2014.
Notice of Allowance for U.S. Appl. No. 13/026,840, mailed Mar. 10, 2014.
Notice of Allowance of U.S. Appl. No. 13/678,543, mailed Dec. 13, 2013.
Notice of Allowance for U.S. Appl. No. 13/835,308, mailed Mar. 14, 2014.
Notice of Allowance for U.S. Appl. No. 13/026,835, mailed Mar. 14, 2014.
Notice of Allowance for U.S. Appl. No. 13/026,725, mailed Mar. 31, 2014.
Notice of Allowance for U.S. Appl. No. 13/026,852, mailed Mar. 20, 2014.
Notice of Allowance for U.S. Appl. No. 13/026,771, mailed Mar. 18, 2014.
Final Office Action for U.S. Appl. No. 13/214,183, mailed Apr. 17, 2014.
"Embedded Systems/Mixed C and Assembly Programming", Wikibooks, Aug. 6, 2009, pp. 1-7.
Notice of Allowance for U.S. Appl. No. 13/761,097, mailed Jul. 15, 2014.
Office Action for U.S. Appl. No. 13/571,797, mailed Apr. 24, 2014.
Notice of Allowance for U.S. Appl. No. 13/590,044, mailed Apr. 29, 2014.
Notice of Allowance for U.S. Appl. No. 13/954,831, mailed May 27, 2014.
Notice of Allowance of U.S. Appl. No. 13/833,044, mailed May 29, 2014.
Notice of Allowance for U.S. Appl. No. 13/761,048, mailed Jun. 10, 2014.
Office Action for Taiwanese Patent Application No. 100129642, mailed May 19, 2014 (with translation).
Office Action for U.S. Appl. No. 13/072,783, mailed Nov. 7, 2013.
Notice of Allowance for U.S. Appl. No. 13/026,840, mailed Jun. 24, 2014.
Notice of Allowance for U.S. Appl. No. 13/214,198, mailed Jun. 23, 2014.
Notice of Allowance for U.S. Appl. No. 13/590,044, mailed Jun. 23, 2014.
Ker et al., "MOS-bounded diodes for on-chip ESD protection in a 0.15-μm shallow-trench-isolation salicided CMOS Process" International Symposium on VLSI Technology, Systems and Applications, 2003, 5 pgs.
Notice of Allowance for U.S. Appl. No. 13/840,965, mailed Jun. 25, 2014.
Office Action for U.S. Appl. No. 13/970,562, mailed Jun. 27, 2014.
Office Action for U.S. Appl. No. 13/835,308, mailed Jun. 27, 2014.
Notice of Allowance for U.S. Appl. No. 13/288,843, mailed Jul. 8, 2014.
Restriction Requirement for U.S. Appl. No. 13/678,539, mailed Jul. 1, 2014.
Notice of Allowance for U.S. Appl. No. 14/231,413, mailed Jul. 18, 2014.
Notice of Allowance for U.S. Appl. No. 13/590,044, mailed Jul. 23, 2014.
Restriction Requirement for U.S. Appl. No. 13/833,067, mailed Jul. 11, 2014.
Notice of Allowance for U.S. Appl. No. 13/954,831, mailed Aug. 4, 2014.

(56) References Cited

OTHER PUBLICATIONS

Restriction Requirement for U.S. Appl. No. 13/678,544, mailed Aug. 1, 2014.
Notice of Allowance for U.S. Appl. No. 13/761,097, mailed Jul. 25, 2014.
Ex parte Quayle for U.S. Appl. No. 13/761,057, mailed Aug. 8, 2014.
Final Office Action for U.S. Appl. No. 13/314,444, mailed May 14, 2014.
Corrected Notice of Allowability for U.S. Appl. No. 13/288,843, mailed Aug. 19, 2014.
Office Action for U.S. Appl. No. 13/590,049, mailed Aug. 29, 2014.
Ex Parte Quayle for U.S. Appl. No. 13/590,047, mailed Aug. 29, 2014.
Ex Parte Quayle for U.S. Appl. No. 13/590,050, mailed Sep. 3, 2014.
Office Action for U.S. Appl. No. 13/678,544, mailed Sep. 12, 2014.
Office Action for U.S. Appl. No. 13/678,539, mailed Sep. 10, 2014.
Notice of Allowance for U.S. Appl. No. 13/288,843, mailed Sep. 18, 2014.
Notice of Allowance for U.S. Appl. No. 13/761,057, mailed Sep. 26, 2014.
Notice of Allowance for U.S. Appl. No. 13/833,044, mailed Sep. 24, 2014.
Notice of Allowance for U.S. Appl. No. 13/314,444, mailed Sep. 24, 2014.
Office Action for U.S. Appl. No. 13/761,045, mailed Sep. 30, 2014.
Notice of Allowance for U.S. Appl. No. 13/835,308, mailed Oct. 10, 2014.
Notice of Allowance for U.S. Appl. No. 13/571,797, mailed Oct. 14, 2014.
Office Action for U.S. Appl. No. 13/833,067, mailed Oct. 20, 2014.
Notice of Allowance for U.S. Appl. No. 14/085,228, mailed Oct. 23, 2014.
Office Action for U.S. Appl. No. 13/842,824, mailed Oct. 29, 2014.
Herner et al., "Vertical p-i-n Polysilicon Diode with Antifuse for stackable Field-Programmable ROM", IEEE Electron Device Letters, vol. 25, No. 5, pp. 271-273, May 2004.
Notice of Allowance for U.S. Appl. No. 13/590,049, mailed Nov. 25, 2014.
Notice of Allowance for U.S. Appl. No. 13/590,047, mailed Nov. 24, 2014.
Office Action for U.S. Appl. No. 13/590,044, mailed Dec. 9, 2014.
Notice of Allowance for U.S. Appl. No. 13/590,050, mailed Dec. 18, 2014.
Office Action for U.S. Appl. No. 14/042,392, mailed Dec. 31, 2014.
Office Action for U.S. Appl. No. 14/071,957, mailed Dec. 29, 2014.
International Search Report and Written Opinion for International Patent Application No. PCT/US/2014/056676, mailed Dec. 19, 2014.
Office Action for U.S. Appl. No. 14/493,083, mailed Jan. 8, 2015.
Office Action for Chinese Patent Application No. 2011102443903, mailed Dec. 16, 2014 (with translation).
Notice of Allowance for U.S. Appl. No. 13/970,562, mailed Jan. 23, 2015.
Notice of Allowance for U.S. Appl. No. 14/493,069, mailed Feb. 17, 2015.
Notice of Allowance for U.S. Appl. No. 14/085,228, mailed Feb. 18, 2015.
Notice of Allowance for U.S. Appl. No. 13/761,045, mailed Feb. 18, 2015.
Notice of Allowance for U.S. Appl. No. 14/231,404, mailed Jan. 22, 2015.
Notice of Allowance for U.S. Appl. No. 14/021,990, mailed Dec. 9, 2014.
Final Office Action for U.S. Appl. No. 13/678,544, mailed Feb. 15, 2015.
Office Action for U.S. Appl. No. 14/101,125, mailed Mar. 6, 2015.
Hassan, "Argument for anti-fuse non-volatile memory in 28nm high-k metal gate", Feb. 15, 2011, wwwl.eeetimes.com publication.
Office Action for U.S. Appl. No. 13/026,783, mailed on Mar. 5, 2015.
Final Office Action for U.S. Appl. No. 13/678,539, mailed Apr. 1, 2015.
Notice of Allowance for U.S. Appl. No. 14/021,990, mailed Apr. 14, 2015.
Notice of Allowance for U.S. Appl. No. 13,842,824, mailed Apr. 14, 2015.
Notice of Allowance for U.S. Appl. No. 14/071,957, mailed Apr. 14, 2014.
Notice of Allowance for U.S. Appl. No. 14/231,404, mailed Apr. 17, 2015.
Notice of Allowance for U.S. Appl. No. 13/590,444, mailed May 12, 2015.
Notice of Allowance for U.S. Appl. No. 13/072,783, mailed May 13, 2015.
Notice of Allowance for U.S. Appl. No. 13,833,067, mailed Jun. 5, 2015.
Office Action for U.S. Appl. No. 13/314,444, mailed Dec. 10, 2014.
Final Office Action for U.S. Appl. No. 13/026,783, mailed Jul. 30, 2015.
Notice of Allowance for U.S. Appl. No. 14/553,874, Aug. 10, 2015.
Office Action for U.S. Appl. No. 14/500,743, mailed Aug. 17, 2015.
Notice of Allowance for U.S. Appl. No. 14/042,392, mailed Aug. 21, 2015.

* cited by examiner

US 9,293,220 B2

LOW-PIN-COUNT NON-VOLATILE MEMORY INTERFACE FOR 3D IC

CROSS-REFERENCE TO RELATED APPLICATIONS

This application is a continuation of U.S. patent application Ser. No. 14/493,069, filed on Sep. 22, 2014 and entitled "Low-Pin-Count Non-Volatile Memory Interface for 3D IC", which is hereby incorporated herein by reference, and which in turn claims priority benefit of U.S. Provisional Patent Application No. 61/880,917, filed on Sep. 21, 2013 and entitled "Low-Pin Count Non-Volatile Memory Interface for 3D IC," which is hereby incorporated herein by reference.

The prior U.S. patent application Ser. No. 14/493,069 is a continuation-in-part of U.S. patent application Ser. No. 13/288,843, filed on Nov. 3, 2011 and entitled "Low-Pin-Count Non-Volatile Memory Interface", which is hereby incorporated herein by reference, and which claims priority benefit of U.S. Provisional Patent Application No. 61/409,539, filed on Nov. 3, 2010 and entitled "Circuit and System of A Low Pin Count One-Time-Programmable Memory," which is hereby incorporated herein by reference.

The prior U.S. patent application Ser. No. 14/493,069 is also a continuation-in-part of U.S. patent application Ser. No. 13/571,797, filed on Aug. 10, 2012 and entitled "System and Method of In-System Repairs or Configurations for Memories", which is hereby incorporated by reference, and which claims priority benefit of: (i) U.S. Provisional Patent Application No. 61/668,031, filed on Jul. 5, 2012 and entitled "Circuit and System of Using Junction Diode as Program Selector and MOS as Read Selector for One-Time Programmable Devices," which is hereby incorporated herein by reference; and (ii) U.S. Provisional Patent Application No. 61/609,353, filed on Mar. 11, 2012 and entitled "Circuit and System of Using Junction Diode as Program Selector for One-Time Programmable Devices," which is hereby incorporated herein by reference.

The prior U.S. patent application Ser. No. 14/493,069 is also a continuation-in-part of U.S. patent application Ser. No. 14/231,404, filed on Mar. 31, 2014 and entitled "Low-Pin-Count Non-Volatile Memory Interface with Soft Programming Capability", which is hereby incorporated herein by reference, and which in turn is a continuation-in-part of U.S. patent application Ser. No. 13/288,843, filed on Nov. 3, 2011 and entitled "Low-Pin-Count Non-Volatile Memory Interface", which is hereby incorporated herein by reference, and which claims priority benefit of U.S. Provisional Patent Application No. 61/409,539, filed on Nov. 3, 2010 and entitled "Circuit and System of A Low Pin Count One-Time-Programmable Memory," which is hereby incorporated herein by reference.

BACKGROUND OF THE INVENTION

Non-volatile memory (NVM) is able to retain data when the power supply of a memory is cut off. The memory can be used to store data such as parameters, configuration settings, long-term data storage, etc. Similarly, this kind of memory can be used to store instructions, or codes, for microprocessors, DSPs, or microcontrollers (MCU), etc. Non-volatile has three operations, read, write (or called program), and erase, for reading data, programming data, and erasing data before re-programming. Non-volatile memory can be a flash memory that can be programmed from 10K to 100K times, or Multiple-Time Programmable (MTP) that can be programmed from a few times to a few hundred times.

One-Time-Programmable (OTP) is a particular type of non-volatile memory that can be programmed only once. An OTP memory allows the memory cells being programmed once and only once in their lifetime. OTP is generally based on standard CMOS process and usually embedded into an integrated circuit that allows each die in a wafer to be customized. There are many applications for OTP, such as memory repair, device trimming, configuration parameters, chip ID, security key, feature select, and PROM, etc.

FIG. 1 shows a conventional OTP cell. The OTP cell 10 has an OTP element 11 and a program selector 12. The OTP element is coupled to a supply voltage V+ in one end and a program selector 12 at the other. The program selector 12 has the other end coupled to a second supply voltage V−. The program selector 12 can be turned on by asserting a control terminal Sel. The program selector 12 is usually constructed from a MOS device. The OTP element 11 is usually an electrical fuse based on polysilicon or silicided polysilicon, a floating gate to store charges, or an anti-fuse based on gate oxide breakdown, etc.

FIG. 2 shows a pin configuration of a conventional serial OTP memory 20. The OTP memory 20 has an OTP memory module 22 and a power-switch device 21 that couples to a high voltage supply VDDP and the OTP memory module 22. The OTP memory 22 has a chip enable, program, clock, power-switch select, and an output signal denoted as CS#, PGM, CLK, PSWS, and Q, respectively. CS# selects the OTP memory 22 for either read or program. PGM is for program or read control. CLK is for clocking the memory 22. PSWS is for turning on an optional device, power-switch device 21. The output signal Q is for outputting data. Since there are several I/O pins, the footprint of an OTP memory to be integrated into an integrated circuit is large and the cost is relatively high.

FIG. 3(a) shows a program timing waveform of a serial OTP memory with the I/O pin configurations as shown in FIG. 2. If the CLK is low and PGM is high when the CS# falls, the OTP goes into a program mode. Then, PGM toggles to high before the rising edges of CLK for those bits to be programmed. The high CLK period is the actual program time. Similarly, FIG. 3(b) shows a read timing waveform of a serial OTP memory with the I/O pin configurations shown in FIG. 2. If the CLK is high and PGM is low when CS# falls, the OTP goes into a read mode. The cell data are read out at the falling edges of CLK one by one. These timing waveforms in FIGS. 3(a) and 3(b) are relatively complicated.

Another similar low-pin-count I/O interface is the Serial Peripheral Interconnect (SPI) that has CSB, SCLK, SIN, and SO pins for chip select, serial clock, serial input, and serial output, respectively. The timing waveform of SPI is similar to that in FIGS. 3(a) and 3(b). Another two-pin serial I/O interface is I²C that has only two pins: SDA and SCL, for serial data and serial clock, respectively. This I/O interface is for an SRAM-like devices that have comparable read and write access time. The I²C for programming a byte or a page in a serial EEPROM is quite complicated: upon issuing a start bit, device ID, program bit, start address, and stop bit, the chip goes into hibernation so that an internally generated programming is performed for about 4 ms. A status register can be checked periodically for completion before next program command can be issued again. In an OTP, the program time is several orders of magnitude higher than the read access and much lower than either the program or erase time of EEPROM, for example 1 us versus 50 ns for read and 1 us versus 4 ms for program/erase, such that I²C interface for OTP is not desirable because of high timing overhead.

As OTP memory sizes continue to be reduced, the number of external interface pins becomes a limitation to the OTP memory size. The current serial interfaces have about 2-5 pins and are not able to effectively accommodate read and program speed discrepancies. Accordingly, there is a need for a low-pin-count interface for non-volatile memory, such as OTP memory.

As integrated circuits reach the limit of scaling in monolithic chips, stacking ICs into a vertical direction becomes a natural choice. When dies are stacked into the third dimension, the so-called "3D IC," OTP memory becomes more important for defect redundancy, device trimming, configuration storage, and parameter adjustments to fix any manufacturing defects or performance degradation during 3D IC processing. In a 3D IC package, bare dies are ground and thinned down from 100 um to about 5-25 um and then stacked on top of each other on a substrate or interposer. At least one Through Silicon Vias (TSV), with diameters in the range of 5-50 um, are drilled through multiple dies for interconnect. A substrate or interposer can be used to support the dies or as a media for interconnecting these dies together.

During the 3D IC processing, some manufacturing defects can be generated to degrade yields, such as particle, contamination, or stress. New failure bits can easily be created in the memory dies. For example, if DRAM can be repaired again after IC package, 2% of yield can be saved. Moreover, thinning down the wafers from 100 um to 5-25 um or less can create stresses in silicon, and further, changing the silicon properties. The stress can affect the device characteristics, such as threshold voltage, leakage, silicon bandgap, or driving capability. The stress can also increase device mismatch and degrade analog performance substantially. For example, any new stress and/or mismatch created can easily affect the performance of A/D, D/A, amplifier, or bandgap reference. For logic chips, changing device performance can affect the relative timing such that clock setup time or hold time can be violated after 3D IC processing. As a result, the 3D IC may not be functional. Different 3D ICs can have different I/O configurations, such as different I/O numbers, I/O termination, I/O driver strength, and I/O capacitive coupling for customization. The configuration settings can vary from one 3D IC to others that need to be stored for tracking.

As more dies are stacked into 3D ICs, manufacturing defects, device trimming, parameter adjustments are needed to tailor for different 3D IC configurations. As a result, there is a need to invent a more systematic approach to improve the yield and performance of a 3D IC by using low-pin-count NVMs, especially low-pin-count OTP memories, much more creatively after the 3D ICs are fabricated.

SUMMARY

The invention relates to a low-pin-count non-volatile memory (NVM) having reduced area and footprint. In one embodiment, the low-pin-count non-volatile memory can use an interface that makes use of only one pin external to an integrated circuit. This interface not only can use only one external pin but also can share several internal pins with the rest of integrated circuit to thereby reduce area and footprint. Moreover, if desired, the one external pin can be further multiplexed with the other pins so that no additional pins are needed. In one embodiment the interface can pertain to a low-pin-count OTP interface for an OTP memory so that the OTP memory can be easily integrated into an integrated circuit.

In one embodiment, a non-volatile memory interface can uses only two signals, PGM and CLK for program control and clock, respectively. By comparing the relative phase between these two signals, the start and stop conditions can be detected. In addition, device ID, read/program/erase mode, and starting address can be determined. Thereafter, read, program, or erase sequences can be signaled. Program assertion and program time can be determined by the pulse width of PGM. So do the erase mode. Finally, the operations are ended with a stop condition. Since the CLK can be shared with the system clock of the integrated circuit, the additional pin for NVM is then the one external pin is PGM.

The invention can be implemented in numerous ways, including as a method, system, device, or apparatus (including graphical user interface and computer readable medium). Several embodiments of the invention are discussed below.

As a 3D IC, one embodiment can, for example, include a plurality of dies stacked on top of each other on at least one substrate or interposer. At least one of the dies can have at least one low-pin-count (LPC) NVMs for repair, trim, or adjustment. The pins in the at least one LPC NVMs can be coupled to further reduce the numbers of total pins for all LPC NVMs combined for external accesses. Reducing the number of pins can be achieved by chaining, broadcasting, or wired-OR. For example, the serial input and serial output of the at least one LPC NVMs can be chained together to reach a pair of serial input and serial output. Signals can be wired to a common bus for broadcasting. Bi-direction signals can be coupled together by wired-OR or open-drain type of circuit for the at least one LPC NVMs so that any signaling can be sent by all LPC NVMs on the bus. Each LPC NVMs can be identified by a unique device ID so that each LPC NVM can be selected for read, program, or erase. It is more desirable that the NVMs are built as OTPs so that logic compatible CMOS processes can be used to fabricate the dies in the 3D IC.

As an electronic system, one embodiment can, for example, include a 3D IC operatively connected to other integrated circuits for processing data, storing data, sensing data, or converting data to achieve system functionality. The 3D IC can include a plurality of dies stacked on top of each other on at least one substrate or interposer. At least one of the dies can have at least one low-pin-count (LPC) NVMs for repair, trim, or adjustment. The pins in the at least one LPC NVMs can be coupled to further reduce the numbers of total pins for all LPC NVMs combined for external accesses. Reducing the number of pins can be achieved by chaining, broadcasting, or wired-OR. For example, the serial input and serial output of the at least one LPC NVMs can be chained together to reach a pair of serial input and serial output. Signals can be wired to a common bus for broadcasting. Bi-direction signals can be coupled together by wired-OR or open-drain type of circuit for the at least one LPC NVMs so that any signaling can be sent by all LPC NVMs on the bus. Each LPC NVMs can be identified by a unique device ID so that each LPC NVM can be selected for read, program, or erase. It is more desirable that the NVMs are built as OTPs so that logic compatible CMOS processes can be used to fabricate the dies in the 3D IC.

As a method for providing low-pin-count NVMs for repairing defects, trimming device mismatch, or adjusting parameters in a 3D IC, one embodiment can, for example, include at least one 3D IC. The 3D IC can include a plurality of dies stacked on top of each other on at least one substrate or interposer. At least one of the dies can have at least one low-pin-count (LPC) NVMs for repair, trim, or adjustment. The pins in the at least one LPC NVMs can be coupled to reduce the numbers of total pins for all LPC NVMs combined for external accesses. Reducing the pins can be achieved by chaining, broadcasting, or wired-OR. For example, the serial input and serial output of the at least one LPC NVMs can be chained together to reach a pair of serial input and serial output. Signals can be wired to a common bus for broadcasting. Bi-direction signals can be coupled together by wired-OR or open-drain type of circuit for the at least one LPC NVMs so that any signaling can be sent by all LPC NVMs on the bus. Each LPC NVMs can be identified by a unique device ID so that each LPC NVM can be selected for read, program, or erase. It is more desirable that the NVMs are OTPs so that logic compatible CMOS processes can be used to fabricate the dies in the 3D IC.

BRIEF DESCRIPTION OF THE DRAWINGS

The present invention will be readily understood by the following detailed descriptions in conjunction with the accompanying drawings, wherein like reference numerals designate like structural elements, and in which.

DETAILED DESCRIPTION OF THE INVENTION

Figure 1:
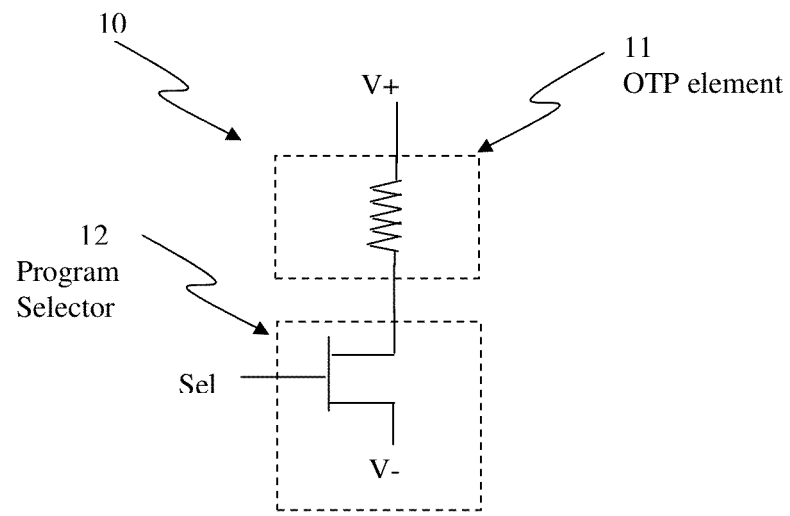
FIG. 1 shows a conventional OTP cell.

The invention relates to a low-pin-count non-volatile memory (NVM) having reduced area and footprint. In one embodiment, the low-pin-count non-volatile memory can use an interface that makes use of only one pin external to an integrated circuit. This interface not only can use only one external pin but also can share several internal pins with the rest of integrated circuit to thereby reduce area and footprint. Moreover, if desired, the one external pin can be further multiplexed with the other pins so that no additional pins are needed. In one embodiment the interface can pertain to a low-pin-count OTP interface for an OTP memory so that the OTP memory can be easily integrated into an integrated circuit.

Simply employing a serial interface is not sufficient for an OTP memory because an OTP memory requires high voltage programming control and has a much longer program time than read time. Also, getting into a program mode at a specific address should be immune to noises and be secure to prevent data corruption.

In one embodiment, a non-volatile memory interface can uses only two signals, PGM and CLK for program control and clock, respectively. By comparing the relative phase between these two signals, the start and stop conditions can be detected. In addition, device ID, read/program/erase mode, and starting address can be determined. Thereafter, read, program, or erase sequences can be signaled. Program assertion and program time can be determined by the pulse width of PGM in program mode. Similarly erase assertion and erase time can be determined by the pulse width of PGM in erase mode. Finally, the operations are ended with a stop condition or running through the whole memory. Since the CLK can be shared or derived from a system clock of the integrated circuit, the additional pin for NVM is then the one external pin denoted PGM.

This invention discloses a two-pin count NVM interface with PGM and CLK for program control and clock, respectively. The CLK can be derived from a system clock in an integrated circuit so that only one additional pin PGM is required for the NVM. In addition, the PGM pin can be further multiplexed with other pins in the integrated circuit to reduce external pins. In the NVM applications for chip ID, serial number, or inventory control, the data are written into and read out from the NVM by controlling the external pin, such as PGM. To further save pin count, the control pin PGM and data output pin Q can be shared in a bi-directional I/O, PGM/Q. This mode is called hardware read and write (HW RAN). In other NVM applications such as security key, PROM code, or configuration parameters, the data stored in NVMs can only be read internally for security reasons, though programming or erasing is still achieved by controlling the external pins. This mode is called hardware write and software read (HW-W-SW-R). The required I/O pins are CLK, PGM, Q, and PGMi. PGM is the only external pin needed for control programming, while PGMi is an internal pin for control reading.

Using low-pin-count (LPC) NVMs in a 3D IC for defect repair, device trimming, or parameter adjustment is disclosed here. In one embodiment, the 3D IC can have a plurality of dies stacked on top of each other on at least one substrate or interposer. At least one of the dies can have at least one low-pin-count (LPC) NVMs for repair, trim, or adjustment. The pins in the at least one LPC NVMs can be coupled together to further reduce the numbers of total pins in the entire LPC NVMs for external accesses. Reducing the total number of pins can be achieved by chaining all serial input and serial output or by broadcasting signals in common buses. For example, the serial input and serial output of the at least one LPC NVMs can be chained together to reach a pair of serial input and serial output, i.e., the serial output of the first LPC NVM can be input to the serial input of the second LPC NVM and the serial output of the second LPC NVM can be input to the serial input of the third LPC NVM, and so on. The input signals of all LPC NVMs can be broadcasted directly by a common bus. Bi-directional pins can be coupled together by a wired-OR or open-drain type of circuit for the at least one LPC NVMs so that the signals can be sent by all LPC NVMs on the buses. Each LPC NVMs can be identified by a unique device ID so that each LPC NVM can be individually selected for read, program, or erase. It is more desirable that the NVMs are built as OTPs so that logic compatible CMOS processes can be used for fabricating the dies in the 3D IC.

The invention can be implemented in numerous ways, including as a method, system, device, or apparatus (including computer readable medium). Several embodiments of the invention are discussed below.

Figure 4A:
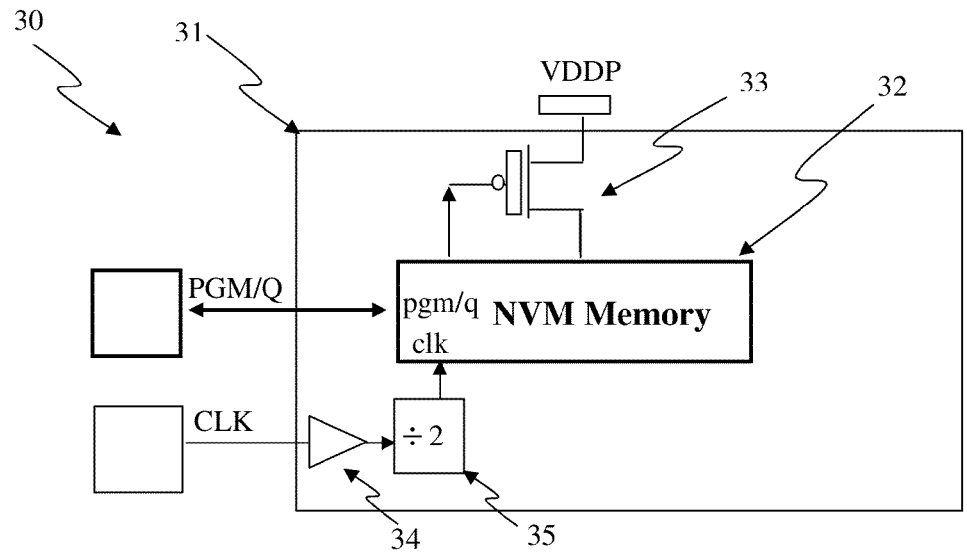
FIG. 4(a) shows a one-pin NVM with hardware read/write (HW RAN) according to one embodiment.

FIG. 4(a) shows a one-pin NVM 30 with hardware read/write (HW RAN) according to one embodiment. An integrated circuit 31 has an NVM memory 32 and a power-switch device 33 coupled between a high voltage pin VDDP and the NVM memory 32. The NVM memory 32 has one pin, clk, internal to the integrated circuit 31 and another pin, PGM/Q, external to the integrated circuit 31. The clk pin can be obtained from an external system clock, CLK, with a buffer 34 and a frequency divider 35. The frequency divider 35, such as divided-by-2, can make phase alignment between PGM/Q and CLK much easier, though can be omitted in another embodiment. It is important to have CLK externally accessible, because generating PGM/Q timing should be aligned with the CLK. PGM/Q is a bi-directional I/O pin that can be used to set control signals as well as to get data out.

Figure 4B:
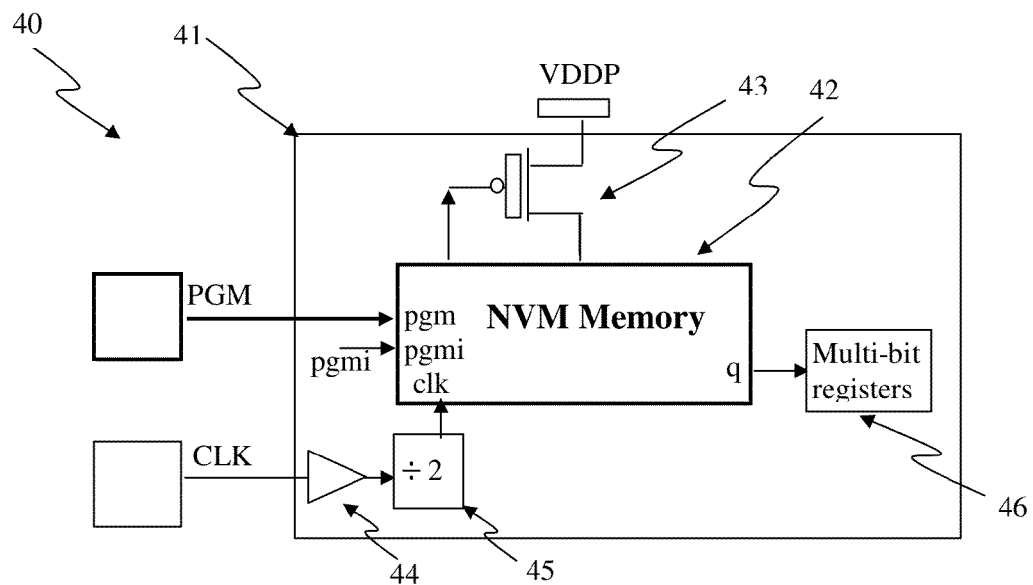
FIG. 4(b) shows a one-pin NVM with hardware write and software read (HW-W-SW-R) according to one embodiment.

FIG. 4(b) shows a one-pin NVM 40 with hardware write and software read (HW-W-SW-R) according to one embodiment. An integrated circuit 41 has an NVM memory 42 and a power-switch device 43 coupled between a high voltage pin VDDP and the NVM memory 42. The NVM memory 42 has three pins, pgmi, clk, and q internal to the integrated circuit 41 and one pin PGM external to the integrated circuit 41. The clk pin can be obtained from an external system clock, CLK, with a buffer 44 and a frequency divider 45. The frequency divider 45, such as a divided-by-2 or higher, can make the phase alignment between PGM and clk can be much easier, though can be omitted in another embodiment. It is important to have CLK externally accessible, because generating PGM timing should be aligned with the CLK. Pgmi is an internal control signal for read, similar to PGM for program and erase. Data pin q is a data out to a multi-bit registers 46 so that the content of the NVM can be accessed by software reading the registers 46.

Figure 4C:
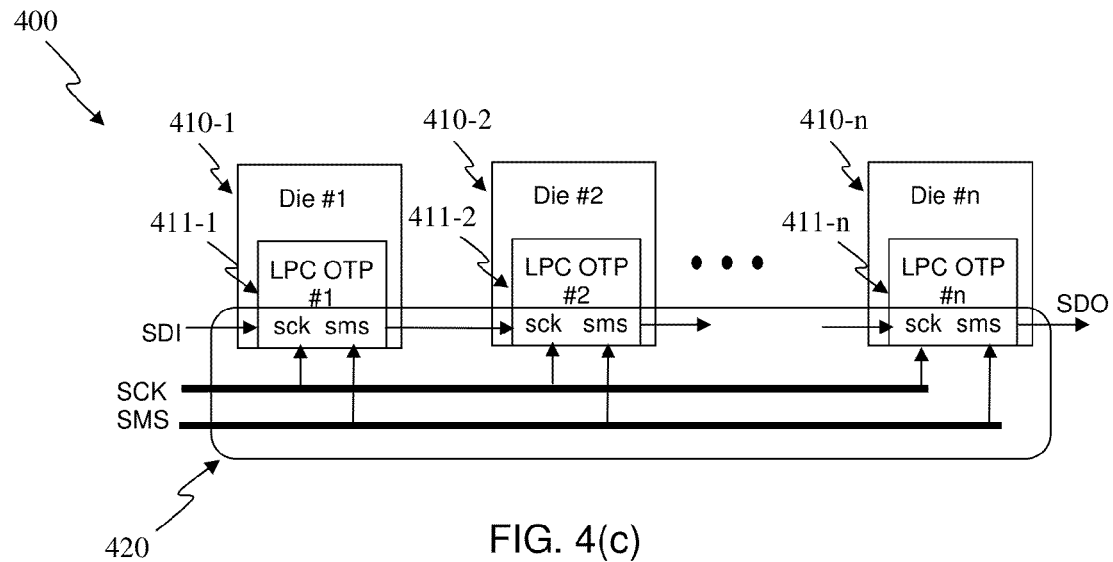
FIG. 4(c) shows a block diagram of using low-pin-count OTP memory in a 3DIC according to one embodiment

FIG. 4(c) shows a block diagram of using low-pin-count NVMs in a portion of a 3D IC according to one embodiment. The 3D IC 400 has a plurality of dies #1, #2, . . . , to #n, denoted as 410-1, 410-2, . . . , 410-n, respectively. At least one of the dies has at least one Low-Pin-Count (LPC) OTP 411-1, 411-2, . . . , 411-n in die 410-1, 410-2, . . . , 410-n, respectively. The input/output pins of the LPC OTP 411-i can be coupled in a block 420 to reduce pin counts for external accesses. Reducing the number of pins can be achieved by chaining or broadcasting. The LPC OTP 411-i (i=1, 2, . . . , n) has a serial input pin SDI, a serial output pin SDO, and other control pins such as serial clock SCK and serial mode select SMS. The serial input SDI and serial output SDO of the dies 411-1 through 411-n can be chained together to have a pair of SDI and SDO as serial input and output of the entire OTPs. The control pins sck and sms of all LPC OTP 411-i (i=1, 2, . . . n) can be coupled together to a common bus SCK and SMS, respectively. For example, each die 410-i can receive any signals broadcasted by SCK or SMS to determine if any valid transactions occur, but each die 410-i can be identified by a unique device ID sent through a stream of data to be matched and selected for data transactions. By a combination of serial input or serial output and/or broadcasting signals, the at least one LPC OTP 411-i (i=1, 2, . . . , n) can be selected for read, program, and/or erase accordingly.

Figure 5A:
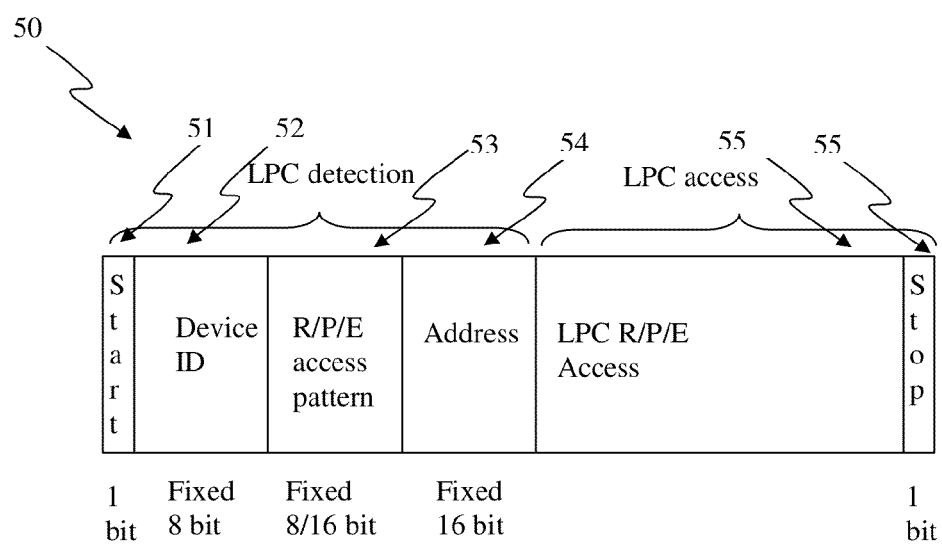
FIG. 5(a) shows a low-pin-count NVM I/O protocol according to one embodiment.

FIG. 5(a) shows a low-pin-count NVM I/O protocol 50 according to one embodiment. The I/O transaction starts with a start bit 51 and ends with a stop bit 55. After detecting the start bit 51, there is a fixed 8-bit device ID code 52 to specify device names and types, such as SRAM, ROM, OTP or device 1, device 2, etc., to access. In one embodiment, device can grant access only when the requested device ID matches the target device ID. Then, there is multiple-bit pattern 53 to specify read, program, or erase. It is very important for an NVM to prevent accidental programming or erasing so that programming or erasing can happen only when detecting special data patterns. The special data pattern to unlock programming can be a log sequence of alternative zeros and ones such as 0101,0101,0101,0101 for read, 1010,1010,1010,10101 for program, and 0101,0101,1010, 1010 for erase. The next field is a starting address 54. Sixteen bits in the address 54 allows memory capacity up to 64K bits. This field can be extended by itself when detecting a device in field 52 that has capacity higher than 64 Kb or using more bits in the address 54. After knowing the device type, read, program, or erase operation, and starting address in fields 52, 53, and 54, respectively, the next step is the actual read, program, or erase. The data access ends when detecting a stop bit 55, or running through the whole memory. The R/P/E access patterns 53 as noted above are exemplary. It will be apparent to those skilled in the art that various modifications and variations can be made.

If the capacity of the NVM is very low, such as 32 bits, 256 bits, or even a few tens of thousand bits, a conventionally rather long LPC detection sequence may defeat the purpose of a simple and reliable I/O protocol. Hence, according to one aspect of embodiment of the invention, a simplified I/O protocol can be provided which has a substantially reduced LPC detection sequence.

Figure 5B:
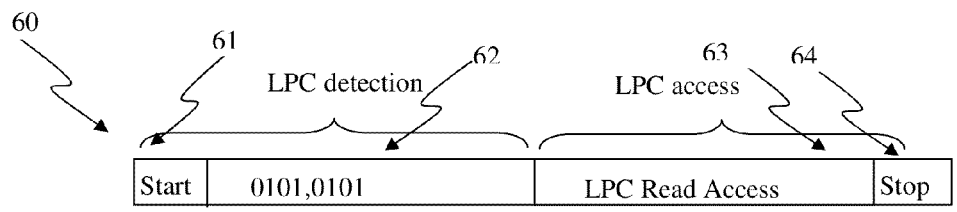
FIG. 5(b) shows a simplified version of low-pin-count NVM protocol for READ according to one embodiment.
Figure 5C:
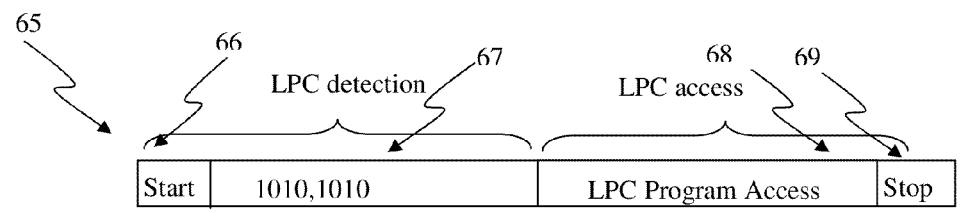
FIG. 5(c) shows a simplified version of low-pin-count NVM protocol for PROGRAM according to one embodiment.
Figure 5D:
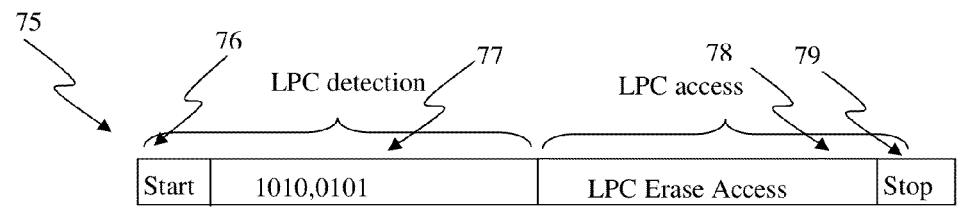
FIG. 5(d) shows a simplified version of low-pin-count NVM protocol for ERASE according to one embodiment.

FIGS. 5(b), 5(c), and 5(d) show simplified versions of low-pin-count NVM protocols for read, program, and erase, respectively, according to one embodiment. FIG. 5(b) shows a low-pin-count read protocol 60 with a start bit 61, LPC detection field 62, LPC Read access 63, and stop bit 64. Similarly, FIG. 5(c) shows a low-pin-count program protocol 65 with a start bit 66, LPC detection field 67, LPC program access 68, and stop bit 69. FIG. 5(d) shows a low-pin-count erase protocol 75 with a start bit 76, LPC detection field 77, LPC erase access 78, and stop bit 79. A simple read, program, or erase sequence, such as 0101,0101, 1010,1010, or 1010, 0101 respectively, grant read, program or erase access in a low capacity NVM. The device ID and starting address fields are omitted. The address starts with the lowest possible address and increments by one after each access. Those skilled in the art understand that the above descriptions are for illustrative purpose. The numbers of fields, number of bits in each field, the order of the fields, address increment/decrement, and actual R/P/E patterns may vary and that are still within the scope of this invention.

Figures 6A, 6B:
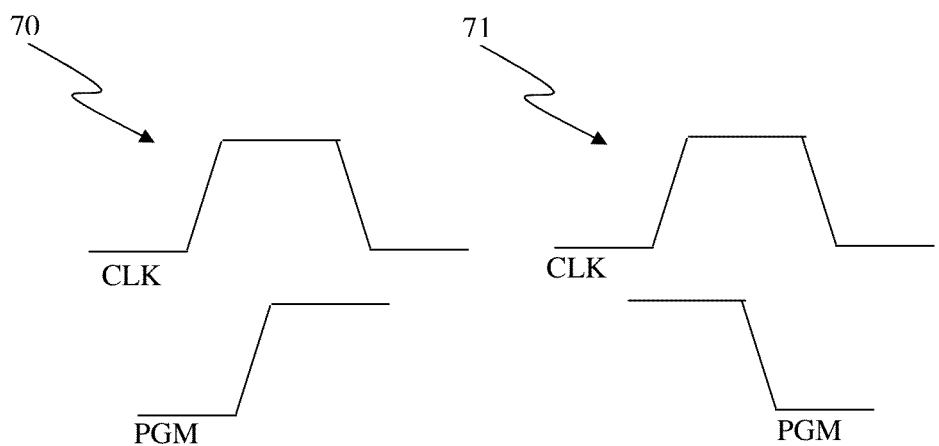
FIG. 6(a) shows a start bit waveform according to one embodiment.
FIG. 6(b) shows a stop bit waveform according to one embodiment.

FIGS. 6(a) and 6(b) show one embodiment of start and stop bit waveforms. When the I/O transaction is inactive, the control signal PGM always toggles at the low CLK period. If the PGM toggles at the high CLK period, this indicates a start or stop condition. The PGM going high during the high CLK period shows a start condition and the PGM going low during the high CLK period shows a stop condition. By using the relative phase between the PGM and the CLK, a chip select function can be provided and a chip select CS# pin can be saved.

Figure 7A:
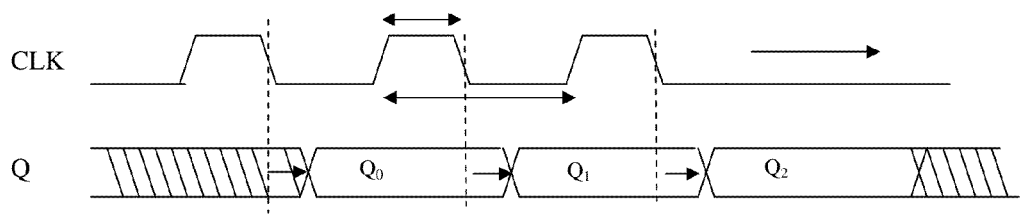
FIG. 7(a) shows a read timing waveform of a low-pin-count NVM in read mode according to one embodiment.

FIG. 7(a) shows a read timing waveform of a low-pin-count NVM in read mode according to one embodiment. Once a read transaction is detected, the data in the NVM can be read out one bit at a time at each falling CLK edge from the starting address. The starting address can be specified in the address field or can be implied as being the lowest possible address. The address can be auto-incremented by one after each access. In a bi-direction I/O, PGM/Q pin is left floating externally after LPC read stage so that the same pin can be used for outputting data.

Figure 7B:
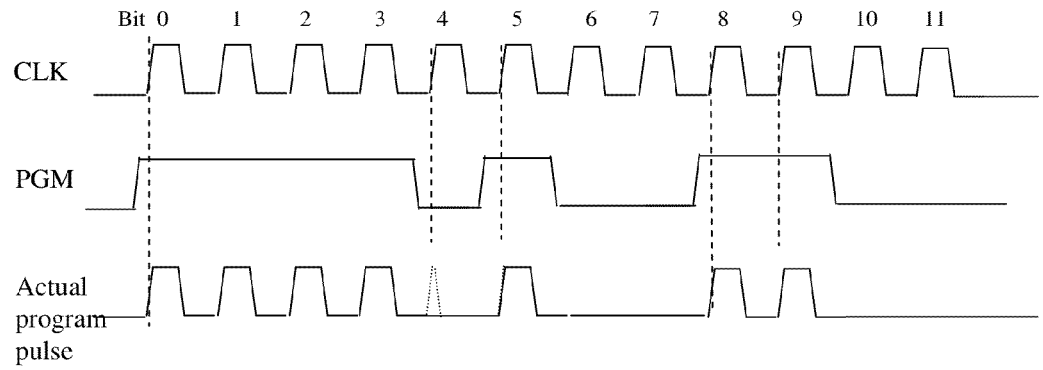
FIG. 7(b) shows a program timing waveform of a low-pin-count NVM in program mode according to one embodiment.

FIG. 7(b) shows a program timing waveform of a low-pin-count NVM in a program mode according to one embodiment. Once a program condition is detected, the I/O transaction goes into the actual programming cycles from the starting address. In one embodiment, the address increments at each falling edge of CLK and programming for each bit is determined if the PGM is high at the rising edge of each CLK. For example, the PGM is high at the CLK rising edge of bit 0, 1, 2, and 3 so that bit 0, 1, 2, and 3 are programmed during the CLK high period. Since PGM is low at the CLK rising edge of bit 4, bit 4 is not programmed. By doing this way, each CLK toggling increments the bit address by one and the PGM high or low at each CLK rising edge determines that bit being programming or not. Actual programming time is the CLK high period.

Figure 7C:
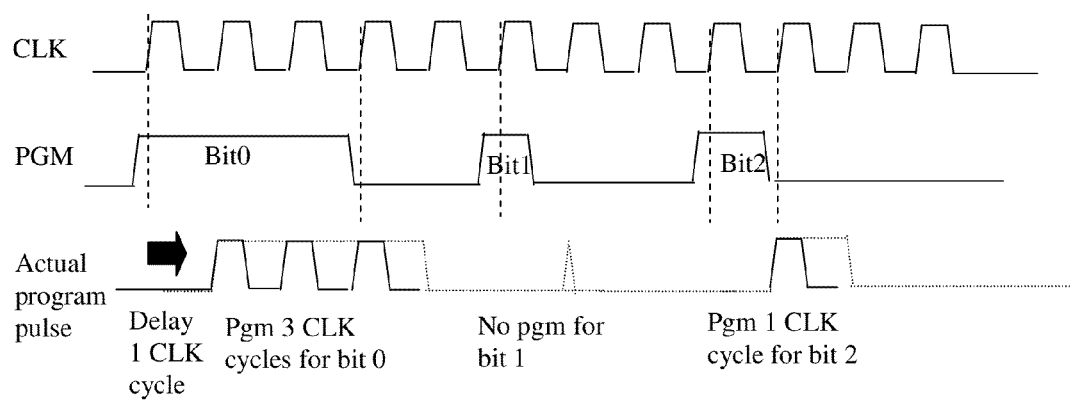
FIG. 7(c) shows a program timing waveform of a low-pin-count NVM in program mode according to another embodiment.

FIG. 7(c) shows a program timing waveform of a low-pin-count NVM in a program mode according to another embodiment. Once the program condition is detected, the I/O transaction goes into the actual programming cycles from the starting address. The program address increments after each low-to-high transition of PGM. The actual program timing depends on the number of whole CLK cycles within each PGM high pulse. For example, in bit 0 the PGM pulse width is larger than 3 CLK cycles to enable actual programming for 3 CLK cycles. In bit 1, the PGM pulse width is less than one CLK period so that bit 1 is not programmed. In bit 2, the PGM pulse width is greater than one CLK period so that bit 2 is programmed for 1 CLK cycle. By doing this way, the CLK frequency can be the same for both read and program, while the program period can be determined by the number of CLK high periods in the PGM high pulse width. The actual program pulses can be delayed by one CLK period to make determining number of CLK cycles easier in one embodiment. The embodiments in FIGS. 7(b) and 7(c) can be applied to erase mode too. In some NVM, an erase operation happens on a page basis. In that case, the erase address can represent a page address, instead of a bit address.

Figure 8A:
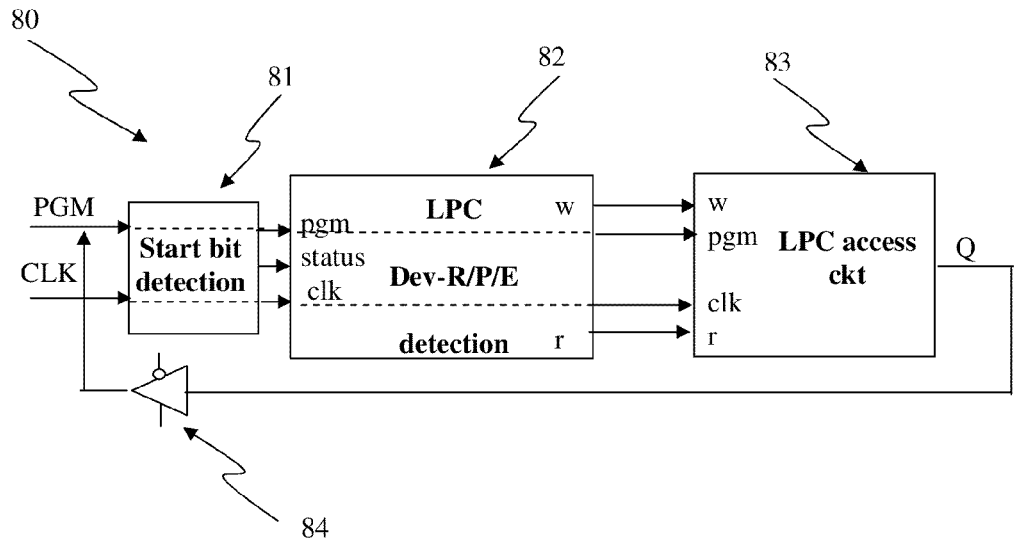
FIG. 8(a) shows a block diagram of a HW R/W low-pin-count NVM according to one embodiment.

FIG. 8(a) shows a block diagram of a HW R/W low-pin-count NVM 80 according to one embodiment. A start bit detection block 81 detects if a starting condition is met by the relative phase between PGM and CLK as shown in FIGS. 6(a) and 6(b). If yes, a LPC Dev-RPE detection block 82 detects if a device ID and read/program/erase access pattern are met, and then obtains a starting address. With a valid read, program, or erase status and the starting address, a LPC access block 83 performs actual read, program, and erase cycles. If the I/O transaction is a read, a tri-state buffer 84 is asserted so that the output Q is re-directed into the same PGM pin (which can serve as a shared PGM/Q pin).

Figure 8B:
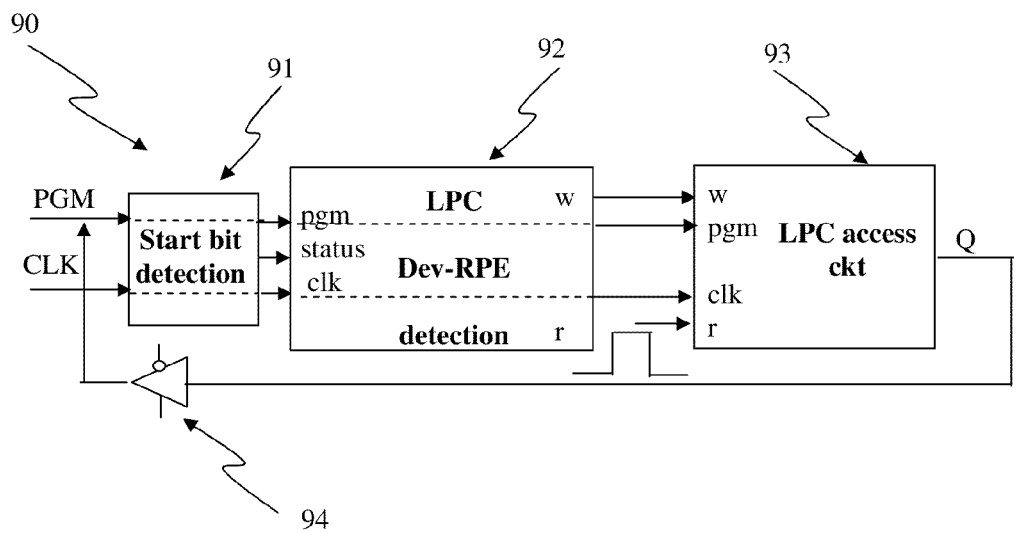
FIG. 8(b) shows a block diagram of another embodiment of HW R/W low-pin-count NVM according to one embodiment.

FIG. 8(b) shows a block diagram of a HW R/W low-pin-count NVM 90 according to one embodiment. A start bit detection block 91 detects if a starting condition is met by the relative phase between PGM and CLK as shown in FIGS. 6(a) and 6(b). If yes, a LPC Dev-RPE detection block 92 further detects if a device ID and program, or erase access pattern are met, and then obtains a starting address. With a valid program, or erase status and the starting address, a LPC access block 93 performs actual program and erase cycles. Granting read access can be made simple by asserting a level or a pulse signal in another embodiment, since read is not a destructive operation. If the I/O transaction is a read, the tri-state buffer 94 is asserted so that the output Q is re-directed into the same PGM pin (which can serve as a shared PGM/Q pin).

Figure 9A:
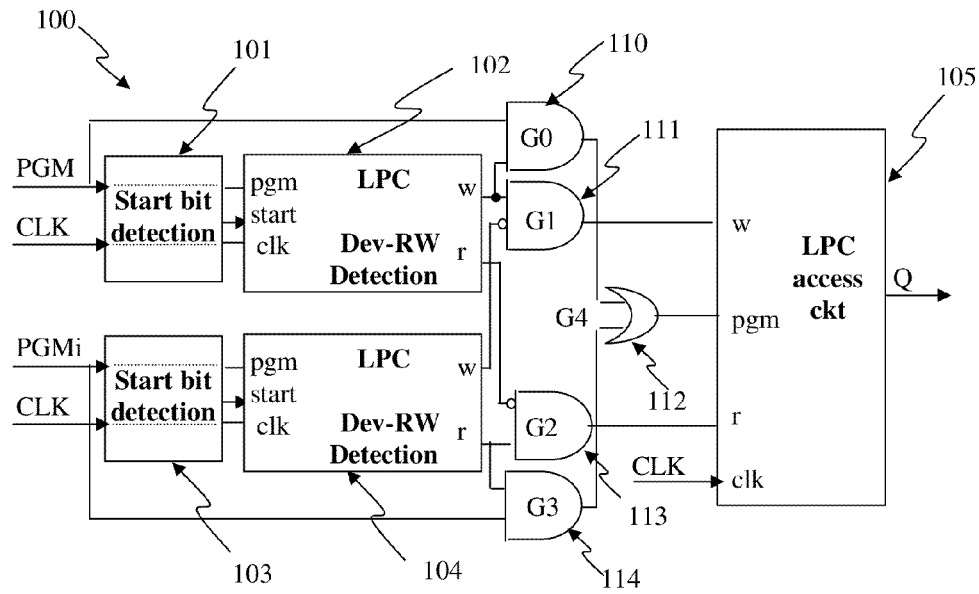
FIG. 9(a) shows one embodiment of a block diagram for HW-W-SW-R low-pin-count NVM according to one embodiment.

FIG. 9(a) shows one embodiment of a block diagram 100 for a HW-W-SW-R low-pin-count NVM according to one embodiment. Program/erase and paths determined by PGM and PGMi go through start bit detection blocks 101 and 103, and LPC Dev-RW detection blocks 102 and 104, separately. These two paths are combined after each block's program/erase and read statuses are determined. The combined program/erase status is a program/erase in program/erase path but not in the read path as realized in gate 111. Similarly, the combined read status is a read in the read path but not in the erase/program path as realized in gate 113. The combined PGM is a program/erase if program/erase status in the program/erase path is asserted, or PGMi if the read status in the read path is asserted, as realized in gates 110, 114, and 112. The data in output Q from a LPC access circuit 105 are stored in internal registers (not shown). The PGMi is held low during program/erase and the PGM is held low during read to prevent interference of read and program/erase. The program/erase status can be two separate bits to indicate either program or erase condition, so are the gates 110 and 111 replicated for program/erase.

Figure 9B:
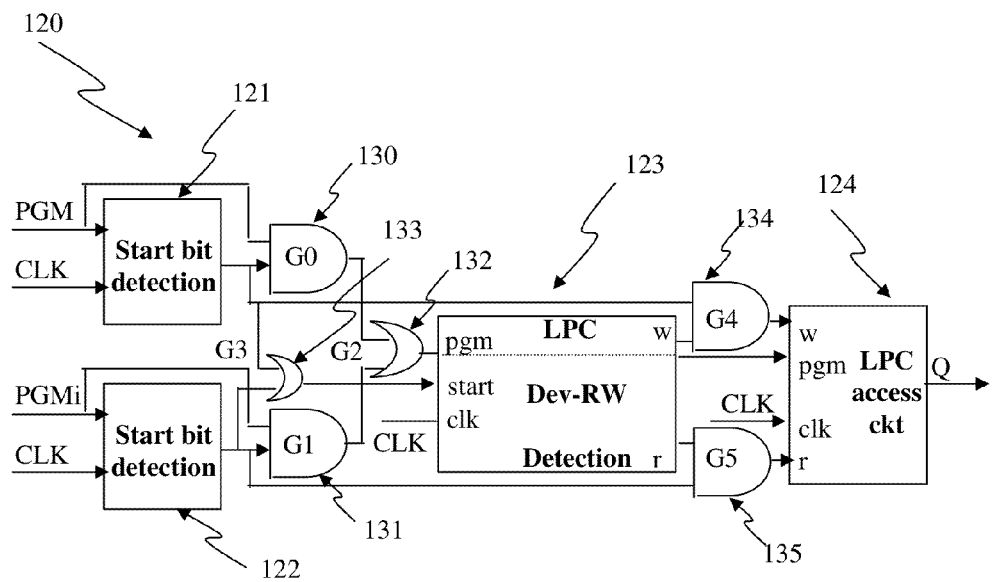
FIG. 9(b) shows yet another embodiment of a block diagram for HW-W-SW-R low-pin-count NVM according to one embodiment.

FIG. 9(b) shows another embodiment of a block diagram 120 for a HW-W-SW-R low-pin-count NVM according to one embodiment. Program/erase and read paths are merged after each path detecting a start bit in 121 and 122, respectively, so that some hardware can be shared. Then the start bits are OR'd to generate a combined start bit as realized in gate 133. The combined PGM at the output of gate 133 indicates a program/erase if a start bit is detected in the program/erase path, or indicates a read if a start bit is detected in the read path, as realized by gates 130, 131, and 132. Then, a single LPC Dev-RW detection block 123 detects device ID, R/P/E pattern, and starting address, if any. A program/erase status detected in the single LPC Dev-RW detection block 123 with a start bit detected in the program/erase path is considered a valid program/erase condition as realized by gate 134. Similarly, a read status detected by the single LPC Dev-RW detection block 123 with a start bit detected in the read path is considered a valid read condition as realized by gate 135. The valid program/erase and read conditions trigger the follow on LPC access circuit 124. Output Q from the LPC access circuit 124 is stored in internal registers (not shown). The block diagram in FIG. 9(b) is a desirable embodiment over that in FIG. 9(a) because the implementation cost is lower. The PGMi is held low during program/erase and the PGM is held low during read to prevent interference of read and program/erase. The program/erase status can be two separate bits to indicate either program or erase condition, so is the gate 134 replicated for program/erase.

Figure 9C:
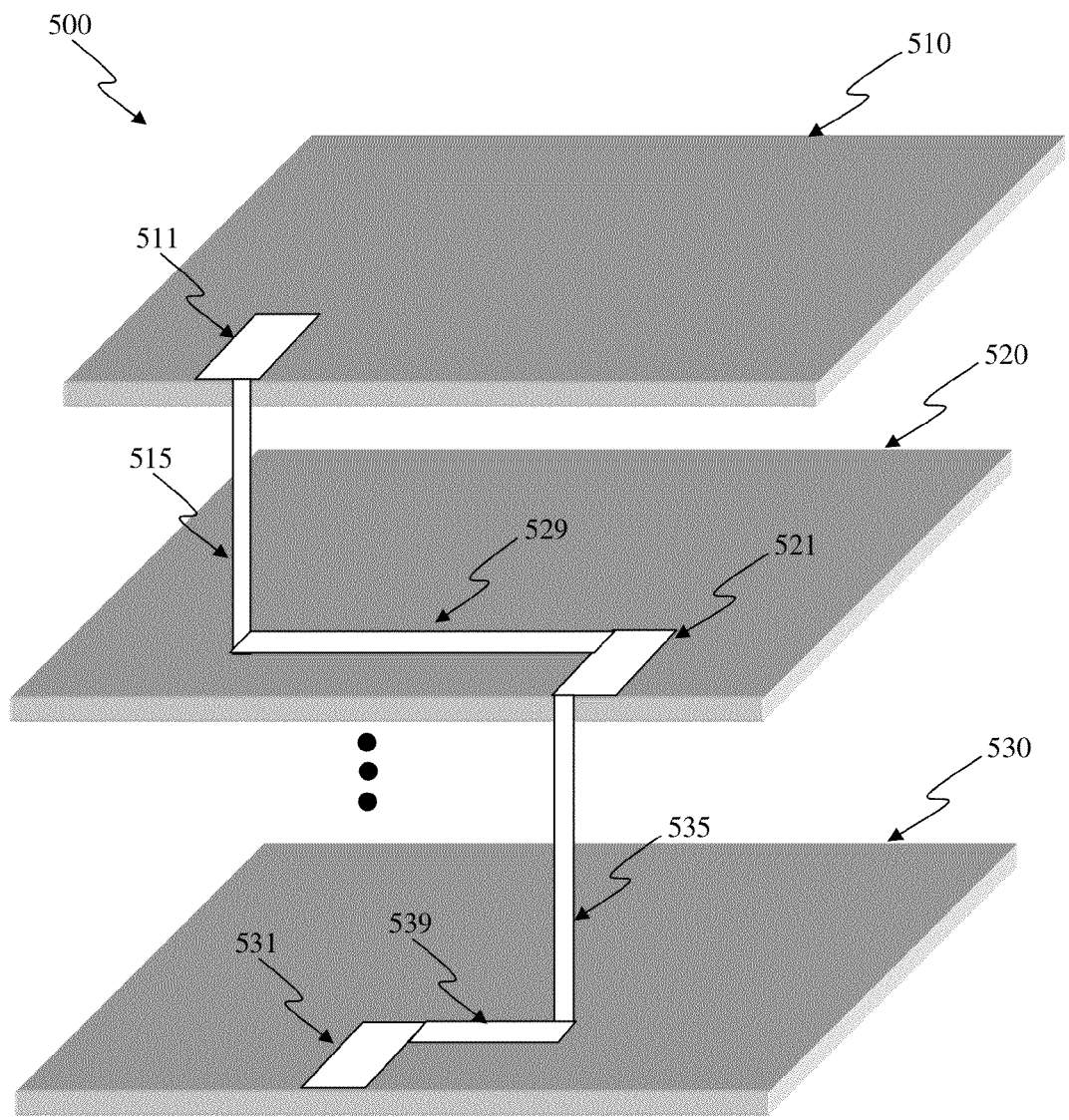
FIG. 9(c) shows a 3D perspective view of a 3D IC using low-pin-count NVM according to one embodiment.

FIG. 9(c) shows a 3D perspective view of a portion of a 3D IC using at least one low-pin-count (LPC) NVM in at least one die according to one of the embodiment. The 3D IC 500 has a plurality of dies 510, 520, and 530 stacked one on top of the others. The dies 510, 520, and 530 can have at least one low-pin-count NVM 511, 521, and 531, respectively, for repair, trim, or adjustment. The LPC NVMs in the three dies are interconnected by at least one Through Silicon Vias (TSV) 515 and 535 between dies 510/520 and 520/530, respectively, and further by metal interconnect 529 and 539 on die 520 and 530, respectively. The LPC NVM 531 can be further coupled to at least one bonding pad (not shown) that can be wire bonded to external pins or through flip-flop to other type of package. In other words, the LPC NVMs in all dies in a 3D IC can be coupled together with only a few (e.g., 2-5) pins for external accesses. This can be achieved by using open drains or wired-OR type of circuit techniques to combine a plurality of signals into one common set of buses. Alternatively, all input signals of each LPC NVM can be wired directly for external access in other embodiment.

The techniques shown in FIG. 9(c) can be used to repair, trim, or adjustment for each individual die after 3D IC package. The low-pin counts NVMs of 2-5 pins in at least one die can be reduced down to only 2-5 external pins for the whole 3D IC. The at least one die in the 3D IC can be selected for repair, trim, or adjustment individually by a unique device ID based on device types. For example, the Most Significant Bits (MSB) of the address field in the device ID, as shown in the device ID 52 in FIG. 5(a), can be used to identify what types of devices as follows:

Logic die: 00xx,xxxx
Analog die: 01xx,xxxx
DRAM die:' 1000,xxxx
SRAM die: 1001,xxxx
Flash die: 1010,xxxx
MEMS die: 11xx,xxxx The Least Significant Bits (LSB) can be used to identify different dies of the same type of dies, such as #1, #2, #3, etc. By using unique device ID in the MSB and die ID in the LSB, the LPC NVMs in at least one die can be selected for read, program, or erase individually.

The LPC NVM in the each die in FIG. 9(c) can have multiple sets of data for different stages of repair, if the LPC NVM is an OTP. For example, if a bandgap reference needs 3 bits to trim the resistance ratios for better performance, an LPC OTP can be built with 3 sets of 4 bits for this purpose with initial data as:

0, 000 (1st set)
0, 000 (2nd set)
0, 000 (3rd set)

The first bit in each set is a valid bit and the following 3 bits are data bits. When the die is in the wafer level, the first set of parameters can be programmed as "1, 101" for the bandgap to have better performance. After the die is thinned down and put into a 3D IC, the second set of parameters can be programmed as "1, 110." After the 3D IC is built into a Print Circuit Board (PCB), the third set of parameter can be programmed as "1,111" for the bandgap to have excellent performance. The final data in the 3 sets are:

1, 101 (1st set)
1, 110 (2nd set)
1, 111 (3rd set)

If the valid bits of the higher order sets are programmed, the data in the higher order set will be used instead. Therefore, the data would be "111" in the PCB. An internal circuit can check if the valid bits of the high-order sets are programmed to select the proper data from.

Figure 9:
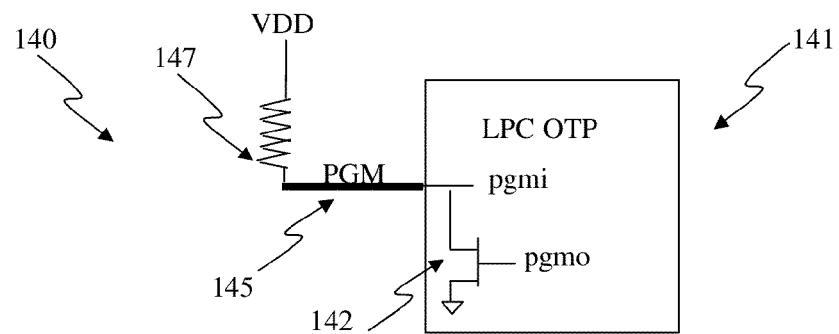
FIG. 9(c1) shows a bi-direction signal in an LPC OTP interfacing to a common bus according to one embodiment.

FIG. 9(c1) shows a bi-direction signal in at least one LPC OTP 141 interfacing to a command bus PGM 145 according to one embodiment. The LPC OTP 141 has a bi-direction signal pgmi coupled to the common bus PGM 145. The LPC OTP 141 also has an internal pulldown MOS 142 with a drain, gate, and source coupled to pgmi, pgmo, and ground, respectively. The pgmo is for sending read data into PGM 145. The external pin PGM can also be coupled to a supply voltage VDD through a resistor pullup 147. During powering up or standby, the pgmo in the LPC OTP 141 is normally low so that the pulldown device is turned off. The pgmo can be asserted only when the LPC OTP 141 is selected for access, the operation to the LPC OTP 141 is a read, and the read data out is a "0". The LPC OTP 141 can be accessed by the signaling of PGM and a CLK (not shown) in an LPC interface protocol. The relative timing of PGM and CLK will be sent to all LPC OTPs through the common bus. If the LPC OTP 141 detects the device ID sent through the bus matching the unique ID of the LPC OTP 141, any subsequent read or program operation can happen to the LPC OTP 141 only. Programming the LPC OTP 141 can proceed as usual. However, if reading the LPC OTP 141, the read data "0" can be sent to the common bus PGM 145 by asserting pgmo, otherwise pgmo remains low. By using this scheme, a bi-direction signal of all LPC OTP can be coupled to a common bus.

Figure 9D:
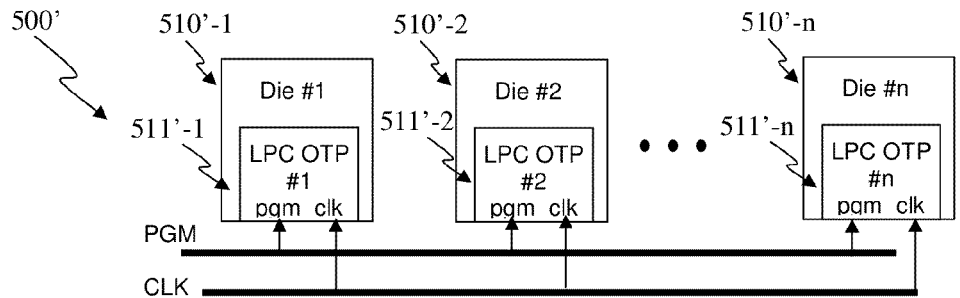
FIG. 9(d) shows a block diagram of electrical connectivity of low-pin-count NVMs in a 3D IC according to one embodiment.
Figure 9E:
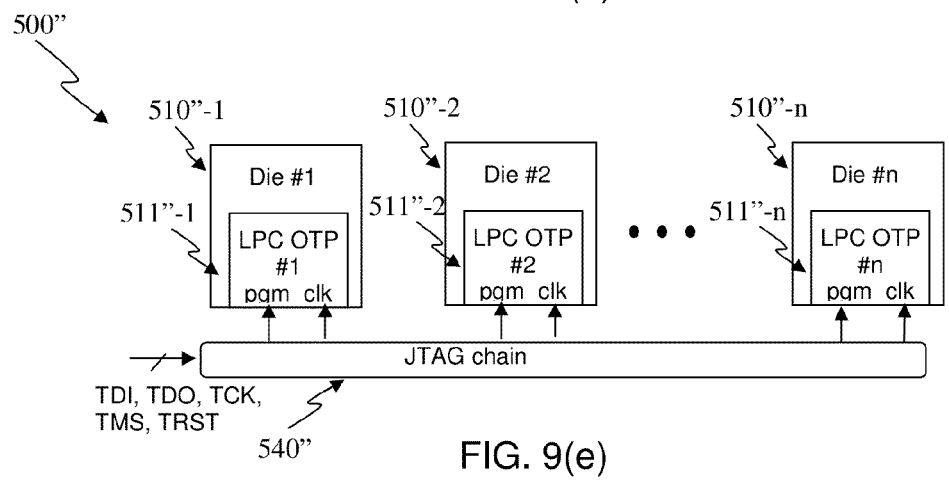
FIG. 9(e) shows a block diagram of electrical connectivity of low-pin-count NVMs in a 3D IC according to another embodiment.
Figure 9F:
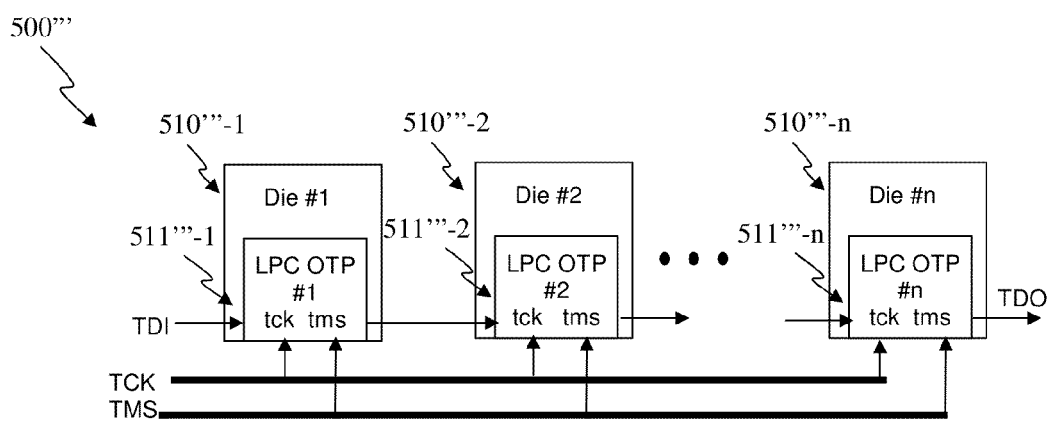
FIG. 9(f) shows a block diagram of electrical connectivity of low-pin-count NVMs in a 3D IC according to yet another embodiment.
Figure 9G:
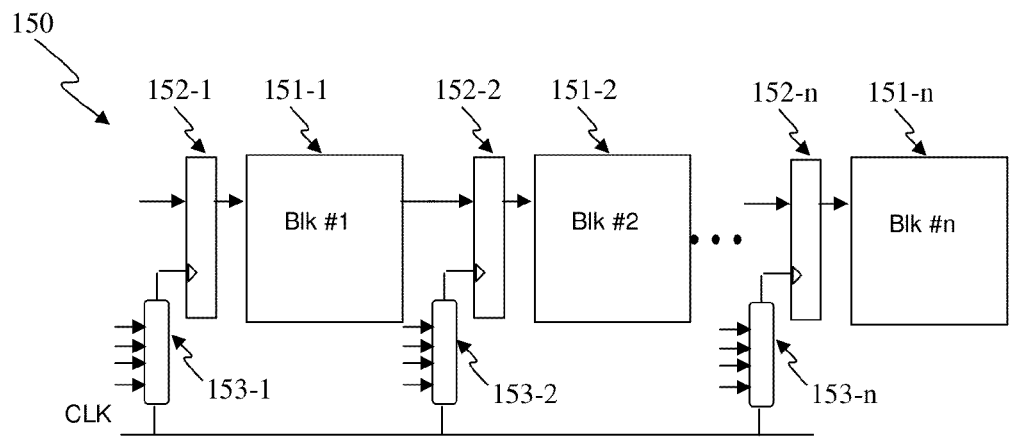
FIG. 9(g) shows a portion of a block diagram of using LPC OTPs to adjust timing delays according to one embodiment.
Figure 9H:
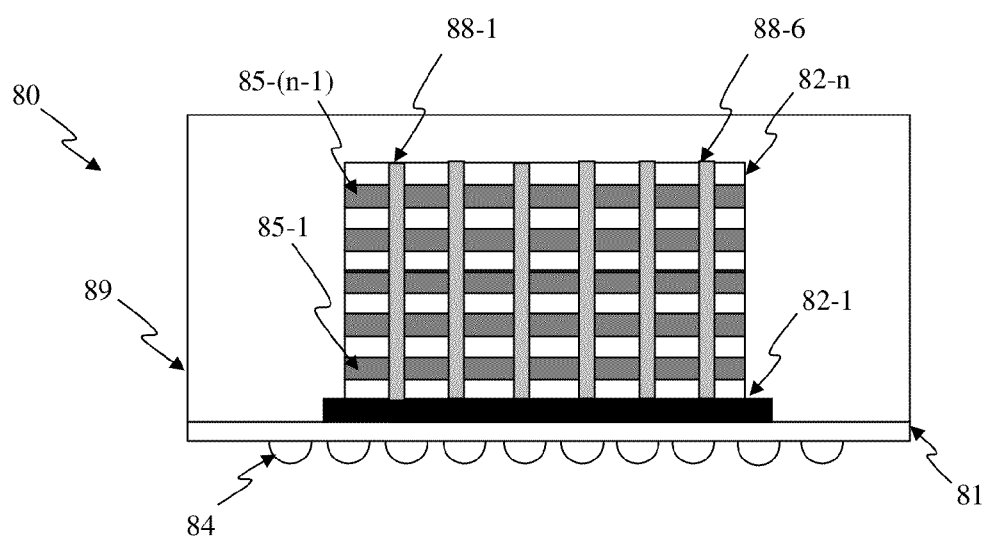
FIG. 9(h) shows a cross section of a 3D IC using low-pin-count NVM according to one embodiment.

FIG. 9(d) shows a portion of a block diagram depicting electrical connectivity of low-pin-count NVMs in a 3D IC according to one embodiment. A 3D IC 500' has n dies, 510'-1 through 510'-n, with n LPC OTPs, 511'-1 through 511'-n, built in each die, respectively. Each LPC OTP has two pins pgm and clk corresponding to the LPC NVMs in FIG. 4(*a*) or 4(*b*). The coupling of pgm from LPC OTP 510'-1 through 510'-*n* to a common PGM can be corresponding to the scheme in FIG. 9(*c*1). The input clk of each LPC OTP 511'-1 through 511'-*n* can be wired together for an external CLK for broadcasting. The pgm of each LPC OTP 511'-1 through 511'-*n* can be either input or output in a bi-direction I/O. The output port of pgm of each LPC OTP 511'-1 through 511'-*n* can be coupled to PGM through a pulldown device for wired-OR, while the input port of each LPC OTP can be coupled to the same PGM by wiring together.

FIG. 9(*e*) shows a portion of block diagram of electrical connectivity of low-pin-count NVMs in a 3D IC according to one embodiment. A 3D IC 500'' has n dies, 510''-1 through 510''-*n*, with n LPC OTPs, 511''-1 through 511''-*n*, built in each die, respectively. Each LPC OTP has two pins pgm and clk corresponding to the LPC NVMs in FIG. 4(*a*) or 4(*b*). The pgm's and clk's of each LPC OTP 511''-1 through 511''-*n* can be coupled to a boundary scan interface 540'', such as JTAG. By using the few pins in the boundary scan, each die's pgm and clk can be accessed for read or program accordingly. A JTAG can, for example, have 5 signals of TDI (Test Data Input), TDO (Test Data Output), TCLK (Test Clock), TMS (Test Mode Select), and TRST (Test Reset) as one embodiment of a boundary scan.

FIG. 9(*f*) shows a portion of a block diagram depicting electrical connectivity of low-pin-count NVMs in a 3D IC according to one embodiment. A 3D IC 500''' has n dies, 510'''-1 through 510'''-*n*, with n LPC OTPs, 511'''-1 through 511'''-*n*, built in each die 510'''-1 through 510'''-*n*, respectively. Each LPC OTP can have a serial input TDI, serial output TDO, serial clock TCK, and serial mode select, TMS, similar to pins in an SPI interface. The serial input and serial output can be cascaded together to generate a single serial input/output for the entire LPC OTP. The tck's and tms's of each LPC OTPs 511''-1 through 511''-*n* can be simply wired to generate TCK and TMS for broadcasting, respectively. The TCK and TMS can be further included in a boundary scan. By using the few pins such as TCK and TMS, each die's tck and tms can be accessed for read or program accordingly. This embodiment has part chaining and part broadcasting to reduce total number of pins in the at least one LPC OTP in a 3D IC.

FIG. 9(*g*) shows a portion of a block diagram 150 of using LPC OTPs to adjust timing delays in at least one die in a 3D IC according to one embodiment. A portion of circuit block 150 has n circuit blocks 151-1, 151-2, . . . , and 151-*n*, which are clocked with flip-flops 152-1, 152-2, . . . , and 152-*n*, respectively. The clocks of the flip-flops are coupled to a master clock CLK through an multi-tap adjustable delay element 153-1, 153-2, . . . , and 153-*n*, respectively. The delay of the master clock CLK to at least one local clock of a flip-flop can be fine tuned by adjusting the multiple taps. The setting of the multiple taps can be controlled by at least one LPC OTP in at least one die in the 3D IC. In a standard logic design methodology, the circuit blocks 151-*i*, and 152-*i* (where i=1, 2, . . . , n) can be automatically generated and 153-*i* (i=1, 2, . . . , n) can be inserted during the synthesis and followed by placement and routing. The multi-tap delay elements can be used to tune timing violations, such as clock setup time and/or hold time, after 3D IC fabrication. The timing violations can be due to stress built up that can affect device performance in 3D IC fabrication. As a result, the propagation delay of a logic gate or a circuit block can be shifted. There can be more than one set of multi-tap to adjust timing parameters in different stages of IC fabrications, such as wafer sort, wafer thin down, TSV fabrication, 3D package, or Print Circuit Board.

FIG. 9(*h*) shows a portion of a cross section of a 3D IC according to another embodiment. The 3D IC 80 has a package body 89 built on a package substrate 81. The substrate 81 can be a small PCB to route signals from dies 82-1, 82-2, . . . and/or 82-*n* in a stack to solder bumps 84. There are n integrated circuit dies 82-1 through 82-*n* stacked one on top of the other. Between the dies 82-*i* (where i=1, 2, . . . , n) are interposers 85-1 through 85-(*n*–1). Through Silicon Vias (TSVs) 88-1 through 88-6 are holes drilled through silicon for interconnect. TSVs 88 can be between one or a few adjacent dies, between any dies to substrate, between any dies to interposer, or can be from the top most die through all dies to the package substrate as shown in FIG. 9(*g*). The TSVs 88 can have very small diameter of ~10 um and can be hundreds or thousands of TSVs in a single die. Moreover, TSVs can be placed any where in a die, instead of placing around the edges of dies in a bonding wire technology. Comparing with bonding wires, TSVs can be smaller and denser, but they are difficult to manufacture and have higher costs. The dies can be CPU, ASIC, analog, MEMS, same kinds of memories such as DRAM, or mixed kinds of memories such as SRAM, DRAM, or flash. There can also be a memory controller built into the stack. The LPC OTP memory for 3D IC defect repair, device trim, or parameter adjustment can be integrated into the at least one dies of SoC, CPU, ASIC, memories or the memory controller within the stack.

The cross section of a 3D IC package shown in FIG. 9(*h*) is for illustrative purpose. There can be many different types of 3D ICs. For example, 3D ICs can be a Multiple Chip Module (MCM) with many chips built on a module, a Multiple Chip Package (MCP) with many chips built on the same package, a Wafer Scale Package (WSP) with a portion of a wafer built in a package, a Chip On Wafer On Silicon (COSWOS) with chips or wafer built on silicon, etc. The stacking in a 3D IC can be die on die, die on wafer, wafer on wafer, with or without interposer between dies. The 3D IC can have at least one Through Silicon Vias (TSV) or at least one wire bonding in the same IC. There are many variations and equivalent embodiments, and that are all within the scope of this invention for those skilled in the art.

Figure 2:
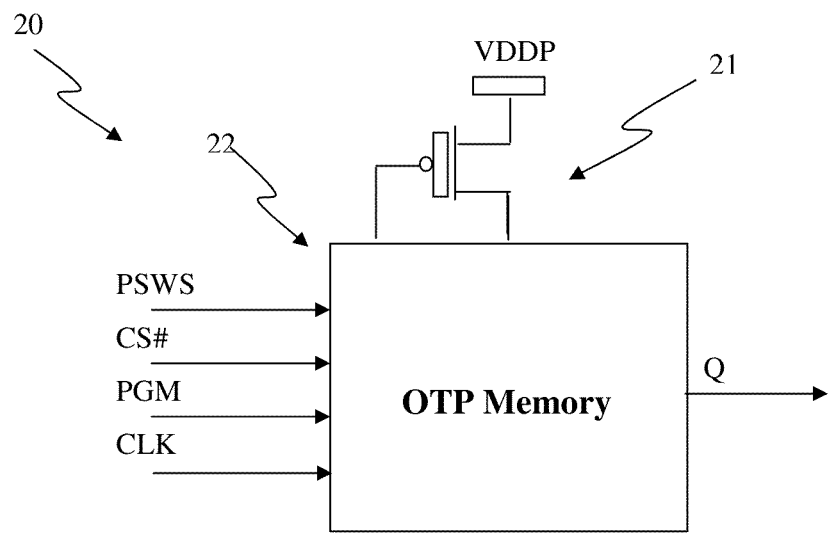
FIG. 2 shows a pin configuration of a conventional serial OTP memory.
Figure 3A:
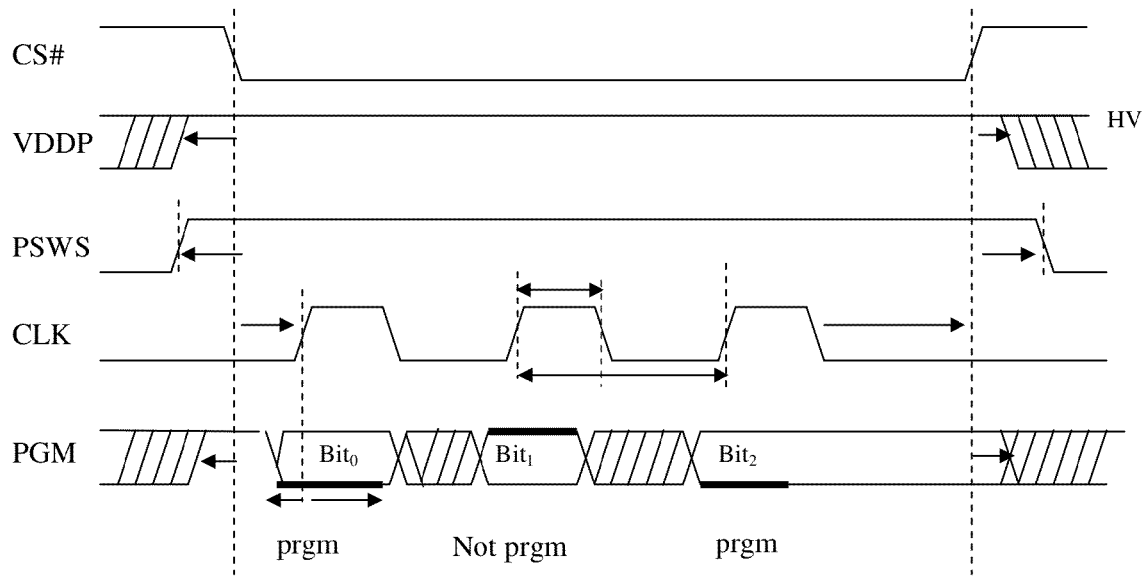
FIG. 3(a) shows a program timing waveform of a serial OTP memory.
Figure 3B:
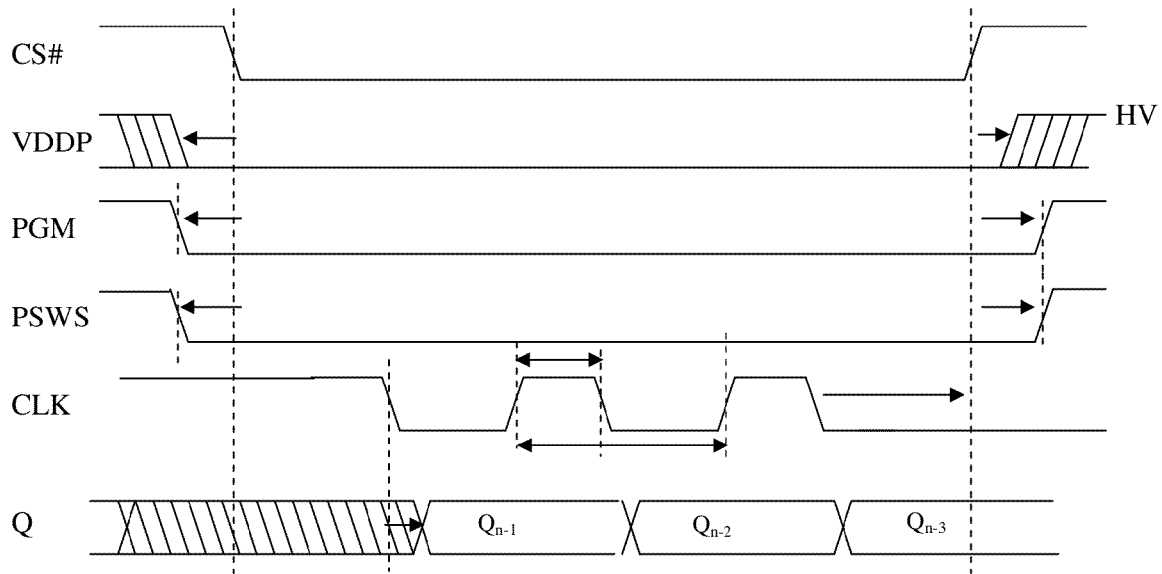
FIG. 3(b) shows a read timing waveform of a serial OTP memory.

The FIGS. 9(*c*)-9(*h*) and the discussions above are for illustrative purposes. The numbers of dies in a 3D IC may vary. The dies in a 3D IC can be homogeneous, which mean they can be dies of the same type, the same kind, from the same vendor, or on the same CMOS technologies in one embodiment. The dies in a 3D IC can also be heterogeneous which means they can be dies of different types (i.e. logic, analog, memory, or MEMS), different kind (i.e. SRAM or DRAM), from different vendor, or on different CMOS technologies. The numbers of TSVs in and/or between dies may vary. The levels of metal interconnect in each die may vary. The numbers and the memory capacities of the LPC NVMs on each die may vary. It is more desirable to use LPC OTP for at least one dies in a 3D IC so that logic compatible CMOS processes can be used without any additional processing steps or masks. The LPC OTP can be any kinds of OTP with any kinds of serial interface. For example, the serial interface can be an LPC I2C-like of interface, with PGM and CLK, as shown in FIG. 5(*a*)-5(*d*), 6(*a*)-6(*b*), 7(*a*)-7(*c*), 8(*a*)-8(*b*), 9(*a*)-9(*d*), or a serial interface as shown in FIG. 2 with CS#, CLK, PGM, and PSW. An SPI-like of serial interface, with CSB, CLK, SI, and SO, can be another embodiment. At least one substrate and/or an interposer can be used to support the dies or as a media for interconnect. Wire bonding, flip-chip, or solder bumps may be used to couple dies to any kinds of package form-factor such as QFP (Quad Flat Package), TSOP (Thin Small-Online Package), or Ball Grid Array (BGA), etc.

There are many variations and equivalent embodiments and that are still within the scope of this invention for those skilled in the art.

Figure 10A:
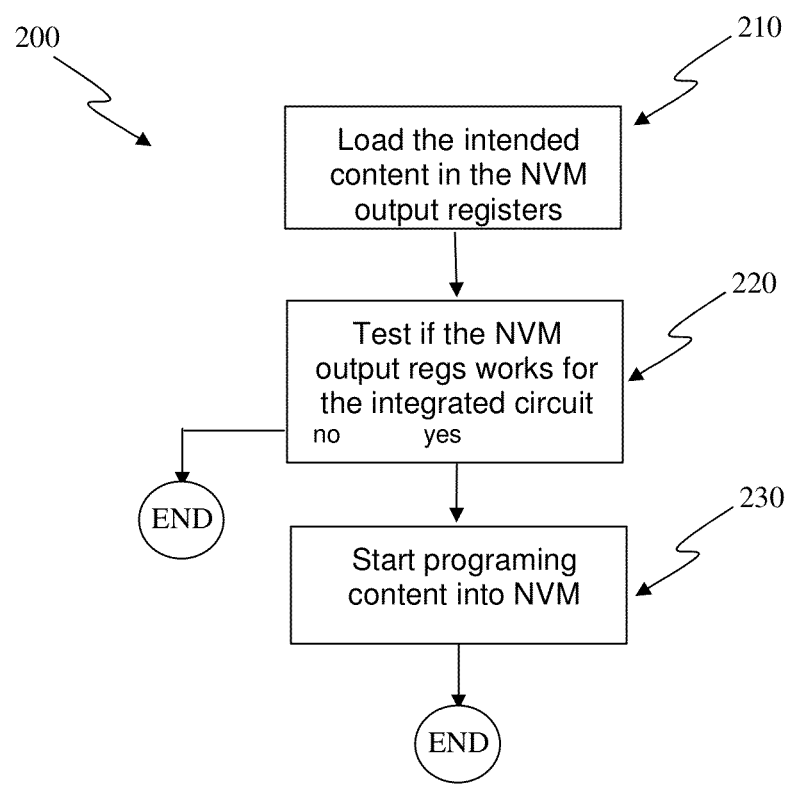
FIG. 10(a) shows a soft program procedure for a low-pin-count NVM according to one embodiment.

In most applications, the NVM data are for device trimming, configuration parameters, memory repair, or MCU code. Data can be loaded into registers to test if they function properly before actually programming to prevent false programming. This technique is called soft program. FIG. 10(a) shows a soft-program procedure 200 for a low-pin-count NVM. The procedure 200 starts with loading the intended NVM data into output registers in 210. Then, the registers are tested to check if they function as expected at 220. If not, no programming would occur. If yes, proceed to start programming the content into the NVM at 230 and stop after finishing. Soft programming is especially useful for OTP because such devices can be only programmed once.

Figure 10B:
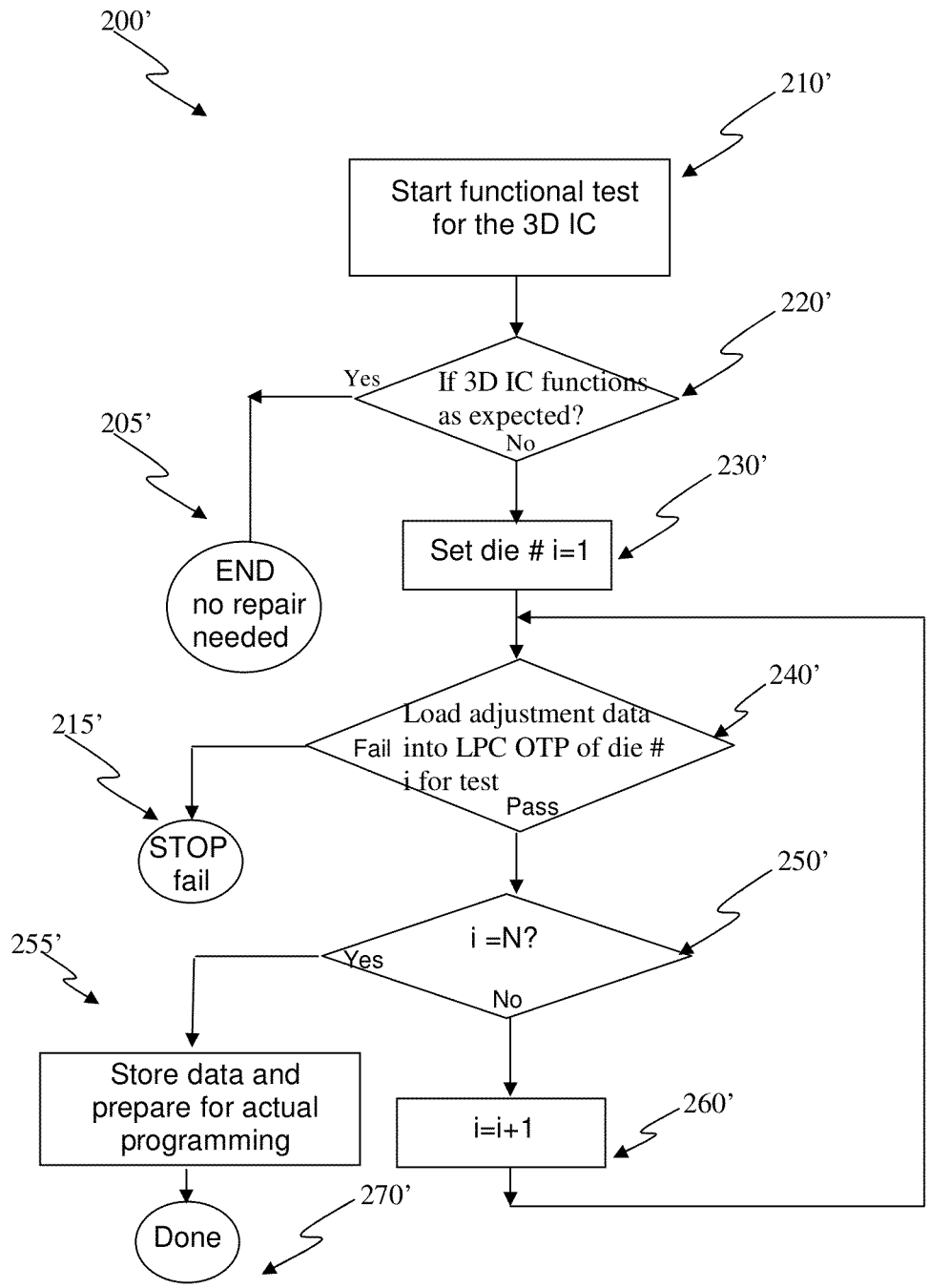
FIG. 10(b) shows a soft program procedure for low-pin-count NVMs in a 3D IC according to one embodiment.

FIG. 10(b) shows a portion of a soft program procedure 200' for low-pin-count NVMs in a 3D IC according to one embodiment. Soft programming the 3D IC starts at 210' with functional tests to verify the entire system functionality of the 3D IC. Then test if the 3D IC functions as expected in step 220'. If yes, the 3D IC is still good and no repairs are required in step 205'. If not, set the die number i equal to 1 in step 230' and prepare to adjust parameters for the first die. Then load the data intended to fix the die i into the LPC OTP of die i as shown in 210 of FIG. 10(a) in step 240'. Soft programming is similar to actual programming except that only volatile data are loaded into registers in the NVMs instead of being actually programmed nonvolatilely. This allows the data being tested thoroughly before actual programming can happen, which is especially important for OTP memory that can only be programmed once. If the testing results fail after trying all kinds of new adjustments, stop testing this 3D IC in 215' with a failure. Otherwise, testing if all the dies in the 3D IC has been done in step 250' by comparing i with N, where N is the total number of dies to be fixed in the 3D IC. If all dies have been tested, the adjustment data can be stored for future programming in step 255'. And then end with a repairable status in step 270'. If the tests have not been done for all dies yet, increment the die number, i=i+1 in step 260', repeat testing in step 240', and follow the same procedure.

Figure 11A:
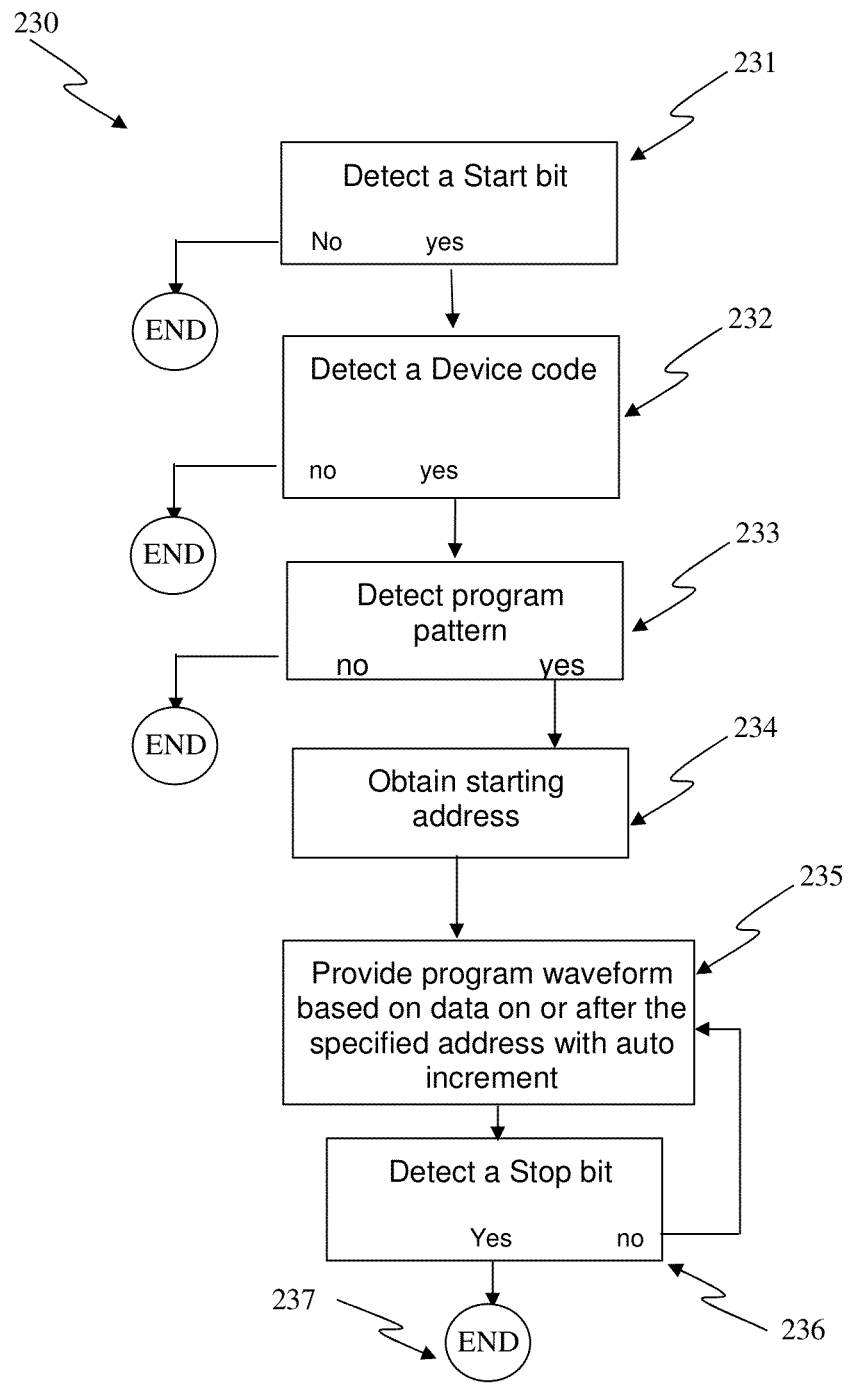
FIG. 11(a) shows a program procedure for a low-pin count NVM according to one embodiment.

FIG. 11(a) shows a program procedure 230 for a low-pin-count NVM according to one embodiment. The procedure 230 starts with detecting a start bit at 231. If a start bit is detected, proceed to detect a valid device ID at 232. If not detected the procedure 230 ends. Then, the procedure 230 proceeds to detect a program pattern at 233. If not detected the procedure 230 ends. The procedure 230 continues to obtain a starting address in 234. After the start bit, device ID, program pattern, and starting address are checked and obtained, the next step would provide an adequate program waveform based on the data for the starting address at 235 and auto increment the address after each programming. The programming progresses until a stop bit is detected in 236, then the procedure 230 finishes at 237. The above discussion is for illustrative purposes. For those skilled in the art understand that some steps can be omitted, the number of bits in each bit field can be different, the bit field order can be interchangeable, and the program pattern can be different and that are still within the scope of this invention.

Figure 11B:
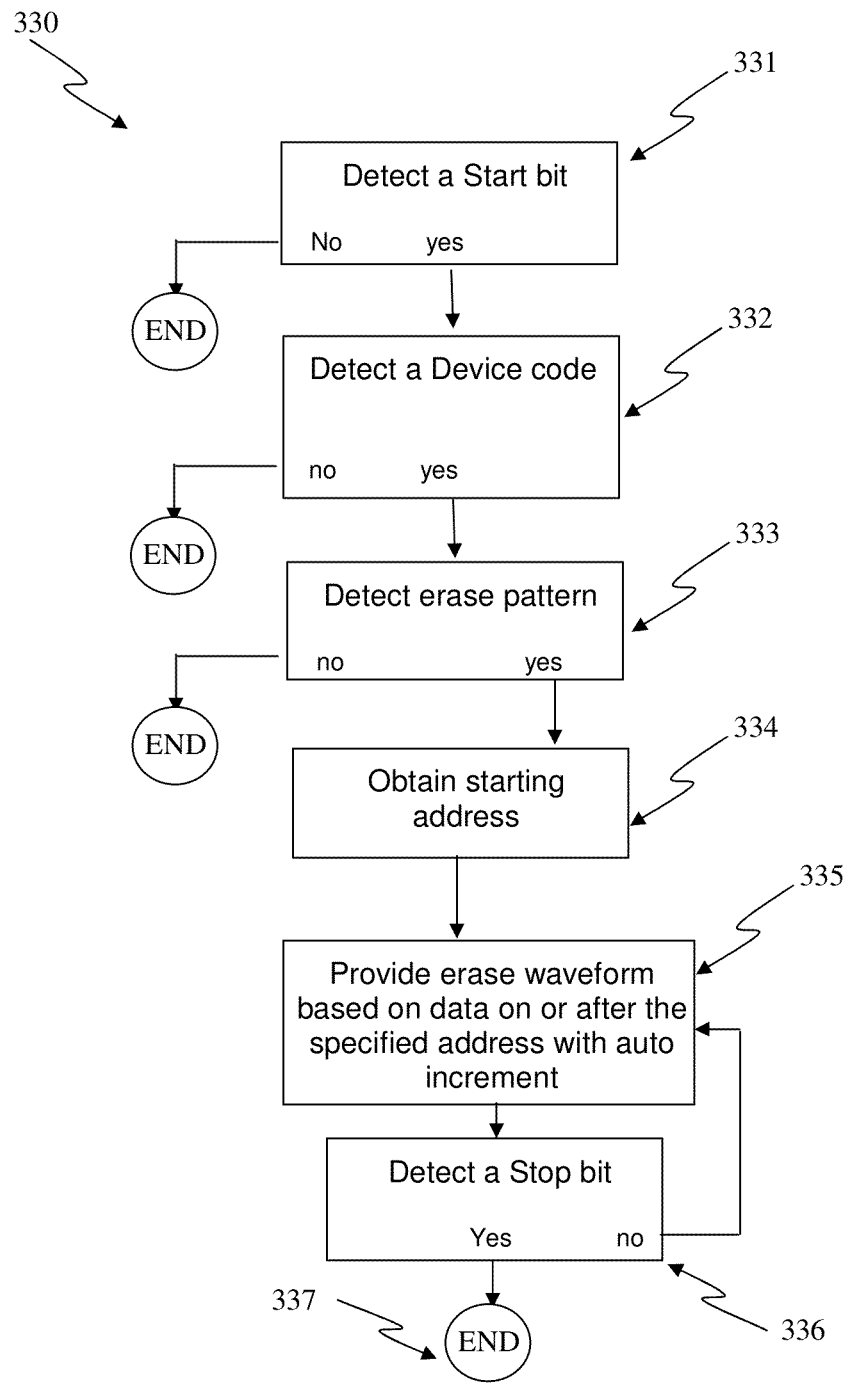
FIG. 11(b) shows an erase procedure for a low-pin count NVM according to one embodiment.

FIG. 11(b) shows an erase procedure 330 for a low-pin-count NVM according to one embodiment. The procedure 330 starts with detecting a start bit at 331. If a start bit is detected, proceed to detect a valid device ID at 332. If not detected, the procedure 330 ends. Then, the procedure 330 proceeds to detect an erase pattern at 333. If not detected, the procedure 330 ends. The procedure 330 continues to obtain a starting address at 334. After the start bit, device ID, erase pattern, and starting address are checked and obtained, the next step would provide an adequate erase waveform based on the data for the starting address at 335 and auto increment the address after each erasing. The erasing progresses until a stop bit is detected at 336, then the procedure 330 finishes at 337. The above discussion is for illustrative purposes. For those skilled in the art understand that some steps can be omitted, the number of bits in each bit field can be different, the bit field order can be interchangeable, the erase pattern can be different, and the address can be a page or block address, and that are still within the scope of this invention.

Figure 11C:
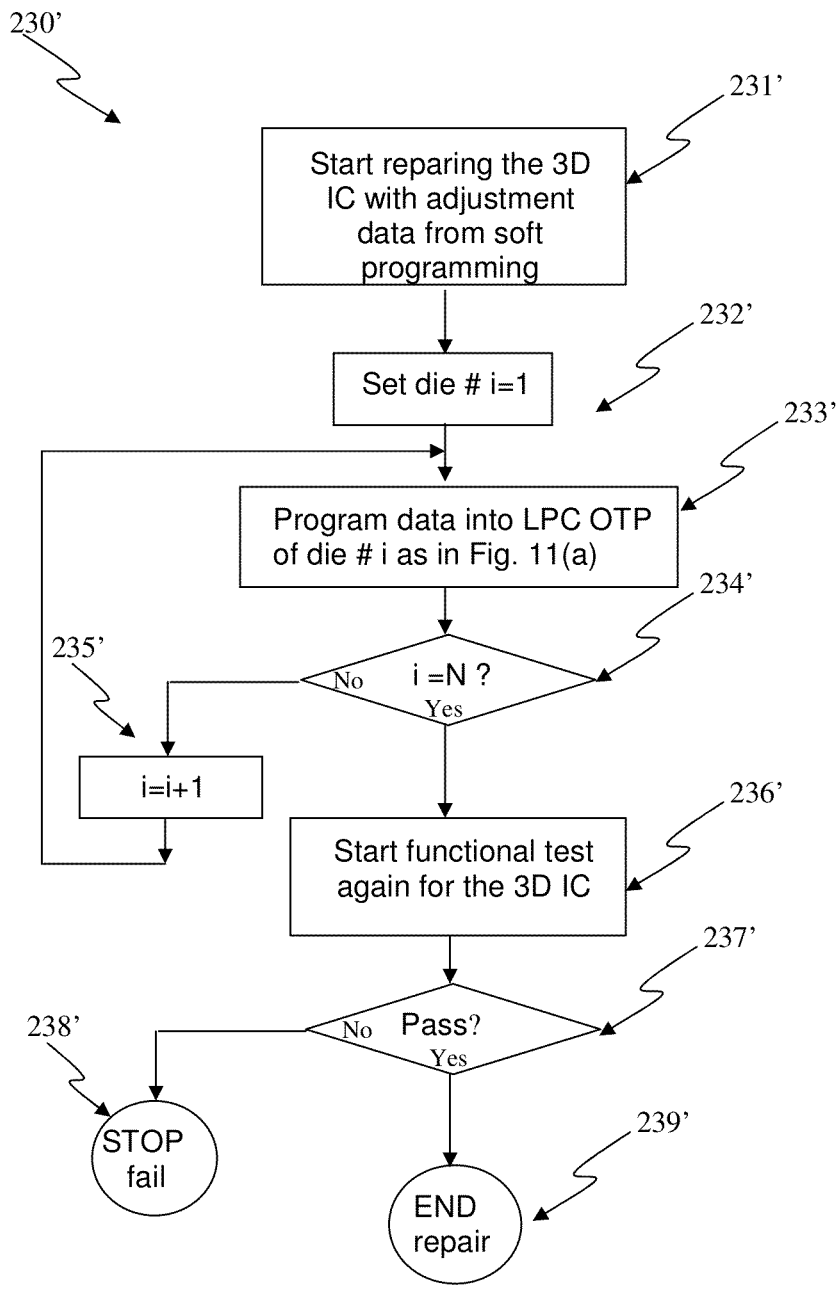
FIG. 11(c) shows a program procedure for low-pin-count NVMs in a 3D IC according to one embodiment.

FIG. 11(c) shows a program procedure 230' for programming low-pin-count NVMs in a 3D IC according to one embodiment. The procedure starts in step 231' to obtain the adjustment data for each die from a soft programming result. Then start with the first die by setting die number i=1 in step 232'. Program the adjustment data into the low-pin-count OTPs of the die i as shown in FIG. 11(a) in step 233'. Then check if all dies in a 3D IC have been programmed in step 234' by comparing i with N, where N is the total number of dies in the 3D IC. If not, increment the die number by 1, i=i+1, in step 235' and go to step 233' to test the next die again. If yes, start functional test again to check if all test vectors can be passed in step 236'. If the test result passes in step 237', the repair is done successfully in step 239'. Otherwise, stop the test with a failure status in step 238'.

Figure 12A:
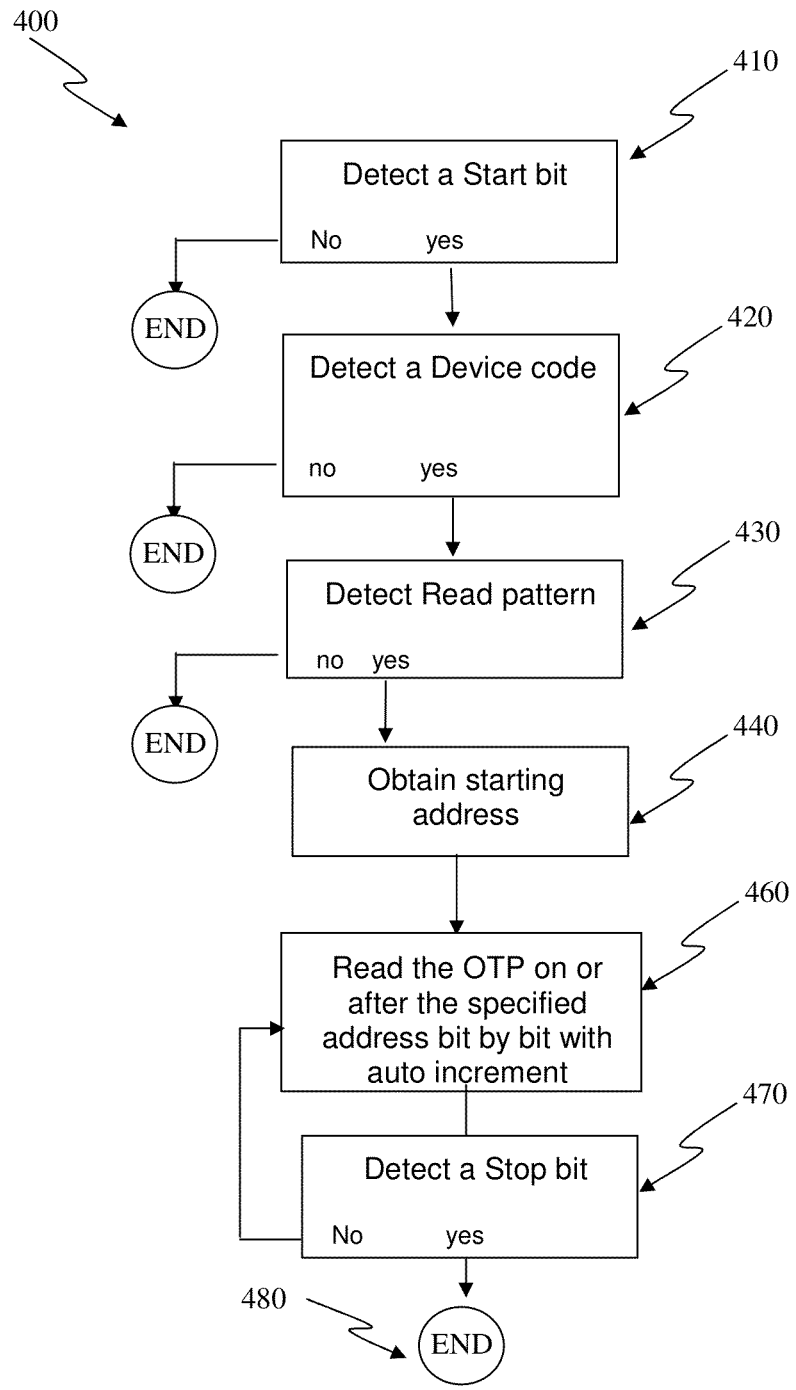
FIG. 12(a) shows a read procedure for a low-pin-count NVM according to one embodiment.

FIG. 12(a) shows a read procedure 400 for a low-pin-count NVM according to one embodiment. The procedure 400 starts with detecting a start bit at 410. If a start bit is detected, proceed to detect a device ID at 420, and end the procedure 400, if not detected. Then, proceeds to detect a read pattern at 430. The procedure 400 continues obtaining a starting address at 440. After the start bit, device ID, read pattern, and starting address are checked and obtained, the next step is to read data bit by bit at the rising or falling edge of each clock cycle at 460 and auto increment the address after each access. The read progresses until a stop bit is detected at 470, then the procedure 400 finishes with an end at 480. The above discussion is for illustrative purposes. For those skilled in the art understand that some steps can be omitted, the number of bits in each bit field can be different, the bit field order can be interchangeable, data readout can be more than one bit at a time, and read pattern can be different, and that are still within the scope of this invention.

Figure 12B:
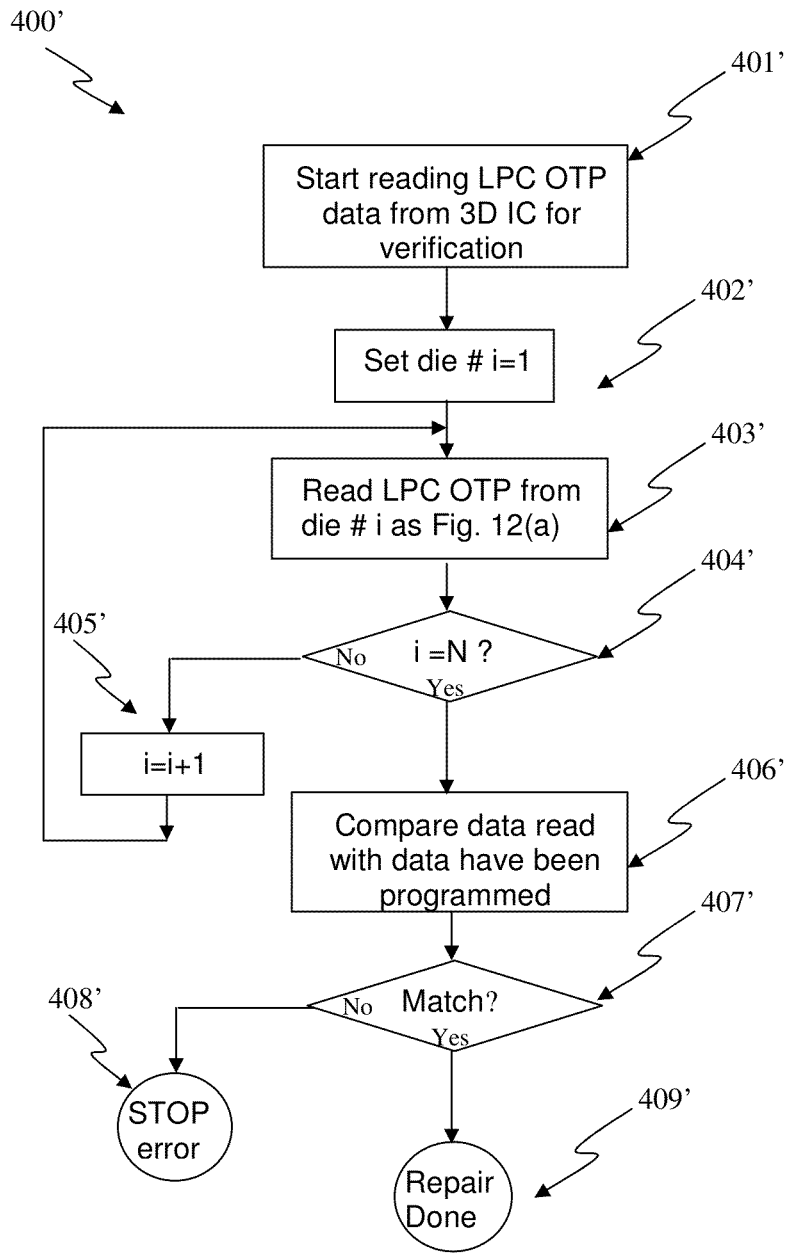
FIG. 12(b) shows a read procedure for low-pin-count NVMs in a 3D IC according to one embodiment.

FIG. 12(b) shows a read procedure 400' for reading data from low-pin-count NVMs in a 3D IC according to one embodiment. The procedure starts in step 401' preparing to read the contents of the LPC NVMs from at least one die in a 3D IC. Then start with the first die by setting die number i=1 in step 402'. Read the contents of the at least one low-pin-count OTPs in the die i as shown in FIG. 12(a) in step 403'. Then check if all dies in a 3D IC have been programmed in step 404' by comparing i with N, where N is the total number of dies to be programmed in the 3D IC. If not, increment the die number by 1, i=i+1 in step 405', and go to step 403' to read the next die again. If yes, compare the data read with the data intended to be programmed in step 407'. If the two sets of data matched, the repair is done successfully in step 409'. Otherwise, stop the read procedure with a failure status in step 408'.

The block diagrams shown in FIGS. 8(a)-8(b), 9(a)-9(g) are for illustrative purpose. The actual circuit and logic implementations may vary. Similarly, the procedures described in FIGS. 10(a), 10(b), 11(a), 11(b), 11(c), 12(a) and 12(b) are for exemplifying purposes. The detailed implementation in the procedures may vary. For example, some steps may be skipped if simplified versions of read, program, or erase protocols in FIG. 5(b), 5(c), or 5(d) are employed. There can be many embodiments of the circuit, logic, block diagram, and procedures and that are still within the scope of this invention for those skilled in the art.

Figure 13:
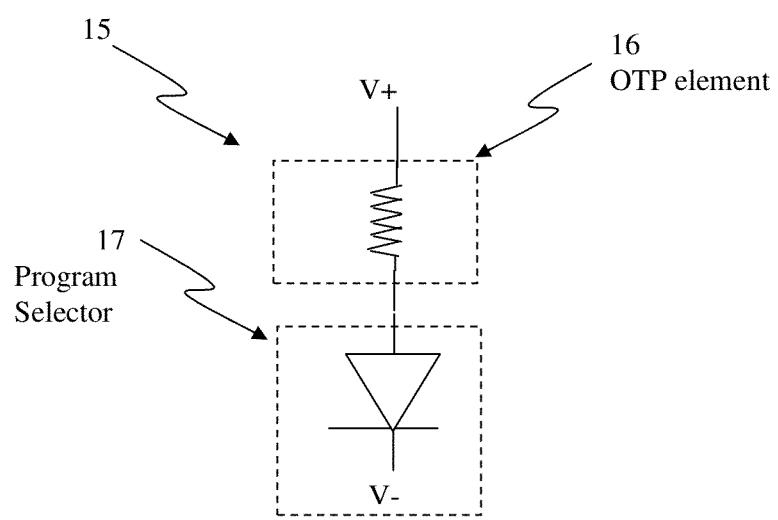
FIG. 13 shows an OTP cell using a diode as program selector according to one embodiment.

FIG. 13 shows an OTP cell 15 as a particular NVM cell using a diode as program selector according to one embodiment. The OTP cell 15 has an OTP element 16 and a program selector 17. The OTP element 16 is coupled to a supply voltage V+ in one end and a program selector 17 at the other. The program selector 17 has the other end coupled to a second supply voltage V−. The program selector is constructed from a diode that can be embodied as a junction diode with a P+ active region on N-well, or a polysilicon diode with P+ and N+ implants on two ends of the polysilicon to constitute a diode. The OTP elements 16 are commonly electrical fuse based on polysilicon or silicided polysilicon, or anti-fuse based on gate oxide breakdown. The low-pin-count NVM interface is readily applicable to the OTP cell 15.

Additional details on OTP devices can be found in: (i) U.S. patent application Ser. No. 13/214,183, filed on Aug. 20, 2011 and entitled "Method and System of Using One-Time Programmable Memory as Multi-Time Programmable in Code Memory of Processors," which is hereby incorporated herein by reference; (ii) U.S. patent application Ser. No. 13/471,704, filed on May 15, 2012 and entitled "Circuit and System of Using Junction Diode as Program Selector for One-Time Programmable Devices," which is hereby incorporated herein by reference; (iii) U.S. patent application Ser. No. 13/026,752, filed on Feb. 14, 2011 and entitled "Circuit and System of Using Junction Diode as Program Selector for One-Time Programmable Devices," which is hereby incorporated herein by reference; and (iv) U.S. patent application Ser. No. 13/026,656, filed on Feb. 14, 2011 and entitled "Circuit and System of Using Polysilicon Diode As Program Selector for One-Time Programmable Devices," which is hereby incorporated herein by reference.

Conventional way of repairing defects is to take the parts or modules down from a system and sent to a technician or repair shop to do the job. This would take lots of time and efforts to repair, calibrate, and adjust the parts or modules. An innovative method to repair a 3D IC in system is disclosed here. In-system repairing a 3D IC is especially important for a 3D IC because any additional manufacture processes, such as thinning down the wafers, inserting interposer, drilling Through Silicon Vias (TSV), or molding, can easily generate more defects or degrade device characteristics. If an electronic system is found not functional, a diagnostic program can be used to check which parts or modules fail. If a 3D IC installed in a system is found not functional well, a diagnostic program can be used to check if repairable. If so, some data or parameters to be updated can be temporarily downloaded (i.e. soft programmed) into the at least one OTP in the defective dies of the 3D IC and then re-run the diagnostic program. If the problem can be fixed, the data or parameters can be used to permanently program into the at least one OTP in the defective dies in the 3D IC. Then, a diagnostic program can be run again to check if the repair is done properly. If so, the 3D IC can still be used and the system can function as before; otherwise, this 3D IC can not be used and needs to be replaced by a new one.

Figure 14:
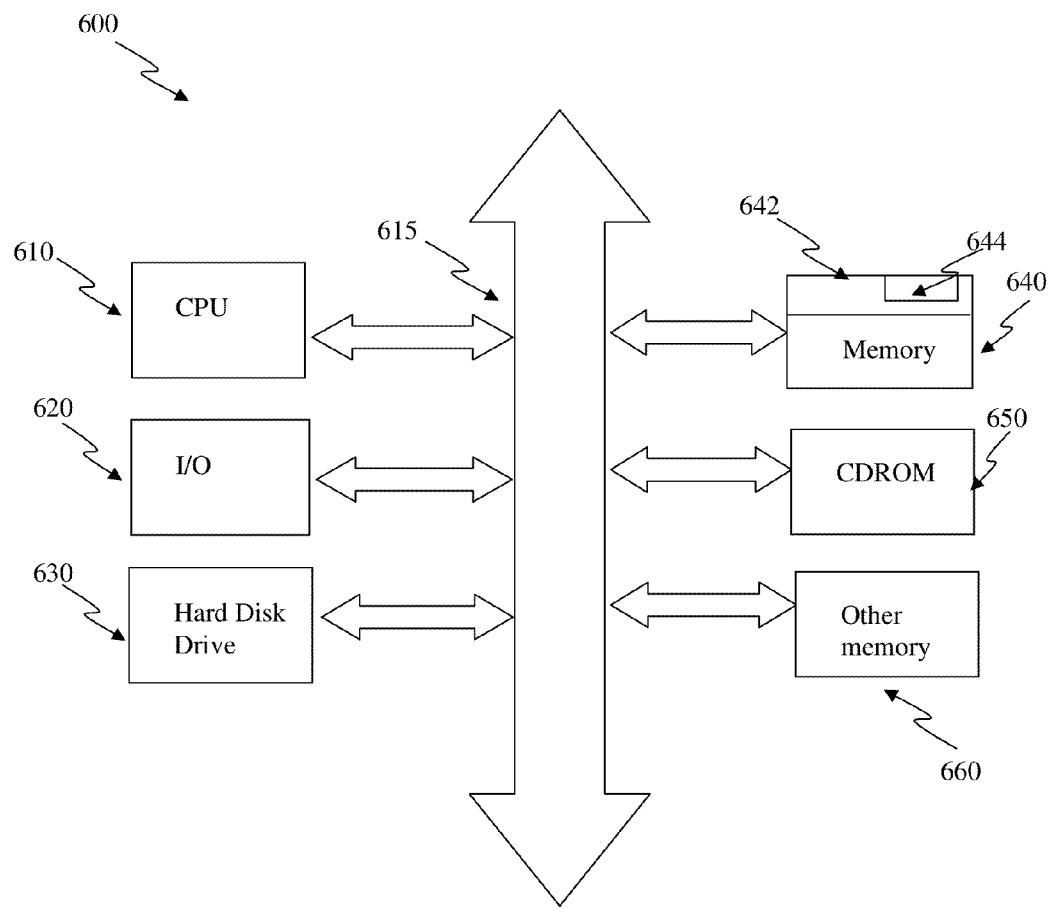
FIG. 14 shows a functional block diagram of a portion of an electronics system using OTP memory in a 3D IC according to one embodiment.

FIG. 14 shows a functional block diagram of an electronic system 600 according to one embodiment. The electronic system 600 can include a memory 640, such as in a memory array 642, OTP memory 644, according to one embodiment. The electronic system 600 can, for example, pertain to a computer system. The electronic system can include a Central Process Unit (CPU) 610, which communicates through a common bus 615 to various memory and peripheral devices such as I/O 620, hard disk drive 630, CDROM 650, memory 640, and other memory 660. Other memory 660 can be a conventional memory such as SRAM, ROM, or flash that can interface to CPU 610 through a memory controller. CPU 610 generally is a microprocessor, a digital signal processor, or other programmable digital logic devices. Memory 640 can be constructed as an integrated circuit, which includes the memory array 642 and at least one OTP memory 644 for in-system repair or configuration. The memory 640 typically interfaces to CPU 610 through a memory controller. If desired, the memory 640 may be combined with the processor, for example CPU 610, in a single integrated circuit. The electronic system 600 can be embodied as a single or a plurality of 3D ICs in part or in all.

Figure 15A:
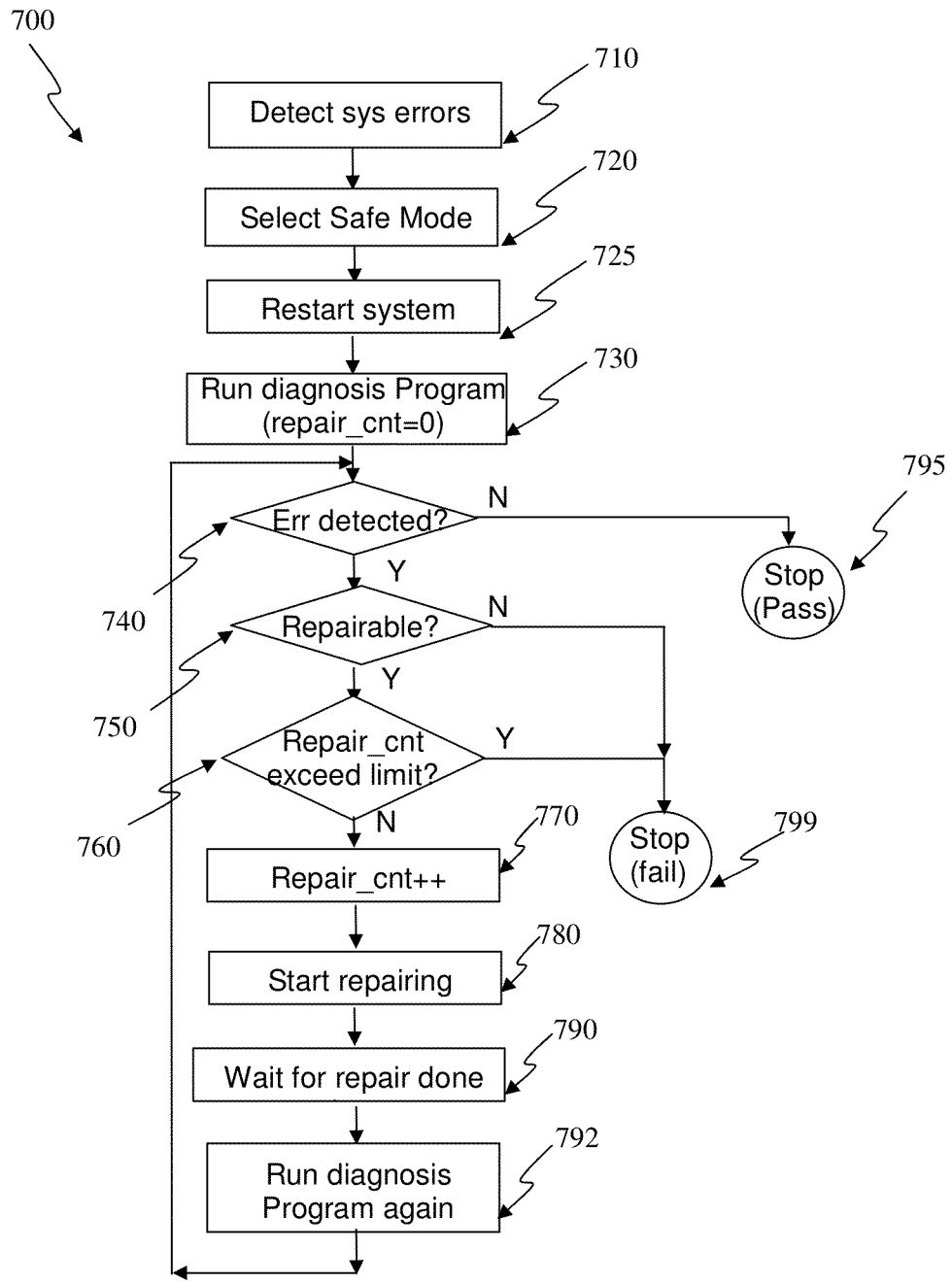
FIG. 15(a) depicts a method in a flow chart to repair or configure memories in a 3D IC according to one embodiment.

FIG. 15(a) shows a flow chart 700 depicting a method for repairing or configuring a memory in a 3D IC, according to one embodiment. The procedure can start at 710 when a 3D IC is not functional. For example, if a 3D IC is used in a Window system, the electronic system may hang and does not respond to any interrupts and/or a display may show a blue screen and display a message such as "System Faults", "Memory Faults", "Bus Errors", etc. in a Windows Operating System (OS). In such cases, a user is recommended rebooting the OS in a privileged mode, i.e., Safe mode in Windows, in step 720 and then restart the electronic system in step 725. Subsequently, a diagnosis can be invoked to figure out what is wrong in the electronic system. Typically, the peripherals such as hard disk, monitor, CDROM, or memories such as DRAM, SRAM, or flash, can be checked. The device status may be showed on the display. Faults in memories can be easily detected by writing data into the memories and read them out to compare with the original data written. A diagnosis program (or program module) can detect any faults in DRAM, SRAM, or flash in step 730. Reset a repair count, repair_cnt=0. If no errors are detected in step 740, this could be a "soft error" due to alpha particles or other non-recurring events such as noise, such that the diagnosis can stop in step 795 and the electronic system can be rebooted. If errors persist, the additional part of diagnosis program needs to check further if the memory or flash faults can be repaired in step 750. The diagnosis program needs to understand how many more defective cells are detected, their locations and memory organization so that the redundancy scheme can be evaluated for possible repairs. This diagnosis program may vary for different memory vendors with different memory organizations and redundancy schemes. If faults are diagnosed as not repairable in step 750, the diagnose stops at 799 with a failure. Otherwise, the repair continues to step 760 to further check if the number of repairs (repair_cnt) exceeds a limit (e.g., 5 times). If the repair count does not exceed a limit, the repair goes on to increment the repair count in 770 and perform actual repairs. If the repair does exceed the limit, the diagnose stops at 799 with a failure. The actual repair starts in step 780. After waiting for the repair to finish in step 790, the diagnosis program can be run again in 792. The repair step 780 can be temporary fixed by loading data into at least one OTP in at least one die in a 3D IC for further testing or a permanent fix by programming data into at least one OTP in the at least one die in a 3D IC. After finishing the diagnosis, the flow can go back to test and detect errors in 740 until all errors are repaired or the repair count exceeds a limit.

Figure 15B:
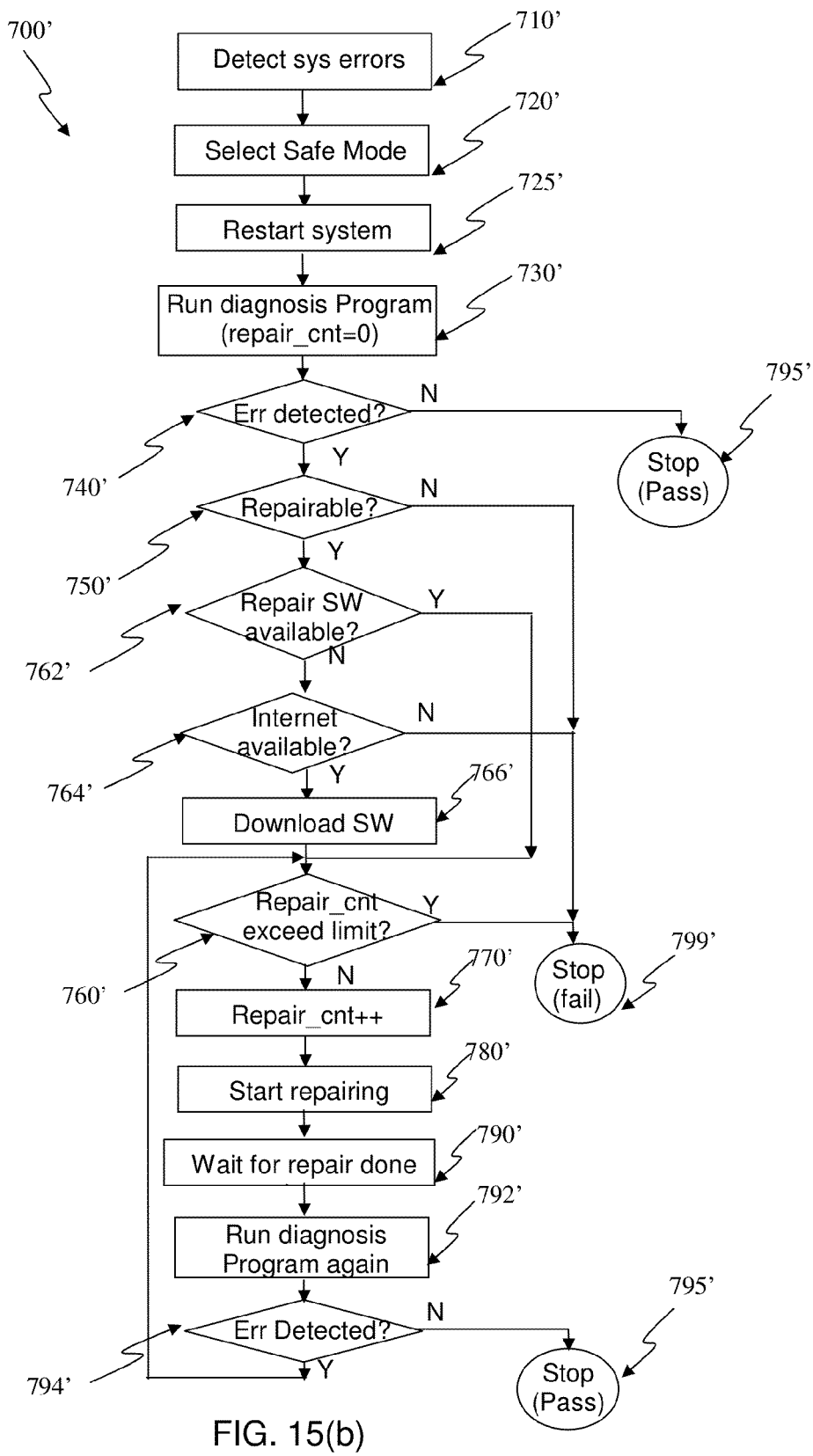
FIG. 15(b) depicts a method in a flow chart to repair or configure memories in a 3D IC with the repair software downloaded from the Internet according to another embodiment.

FIG. 15(b) shows a flow chart 700' depicting a method for repairing or configuring a memory in a 3D IC using Internet, according to another embodiment. The procedure starts at 710' when an electronic system is not functional. For example, in a Window system a user is recommended rebooting the OS in a privileged mode, i.e., Safe mode in Windows, in step 720' and then restart the electronic system in step 725'. Subsequently, a diagnosis can be invoked to figure out what is wrong in the electronic system in step 730'. Typically, the peripherals such as hard disk, monitor, CDROM, or memories such as DRAM, SRAM, or flash can be checked. The device status may be showed on the display. Faults in memories can be detected by writing data into the memories and read them out to compare with the data written. A diagnosis program (program module) can detect any faults in DRAM, SRAM, or flash in step 740'. If no memory errors are detected, this could be a "soft error" due to alpha particles or other non-recurring events such as noise, such that the diagnosis can stop in step 795' and the system can be readily rebooted. If the errors persist, an additional part of the diagnosis program needs to check if the memory faults can be repaired in step 750'. The diagnosis program needs to understand how many more defect cells are detected, their locations, and memory organization so that the redundancy scheme can be evaluated for possible repairs. The diagnosis program may vary for different memory vendors with different memory organizations and redundancy schemes. If the memory faults are diagnosed as not repairable in step 750', the diagnoses stop at 799' with a failure. Otherwise, the repair continues to step 762' to check if any repair software is available. If yes, continue to step 760' to check if the number of repairs (repair_cnt) exceeds a limit (e.g., 5 times). If not, check if Internet connection is available in 764'. If Internet is not available in 764', stop the repair with a failure in 799'. If the Internet is available, proceed to download the repair software in 766'. Then, check if repair count (repair_cnt) exceeds a limit (e.g., 5). If the repair count exceeds the limit, stop the repair with a failure in 799'. If the repair count does not exceed the limit, increment the repair count in 770', and start repairing in 780'. After waiting for repair to finish in 790', the diagnosis program can be run again in 792' to check if any faults are existent in 794'. If no, stop the repair with a pass in 795'. If yes, go back to check repair count in 760'. This loop continues until all repairs are done or repair count exceeds a limit.

Figure 16:
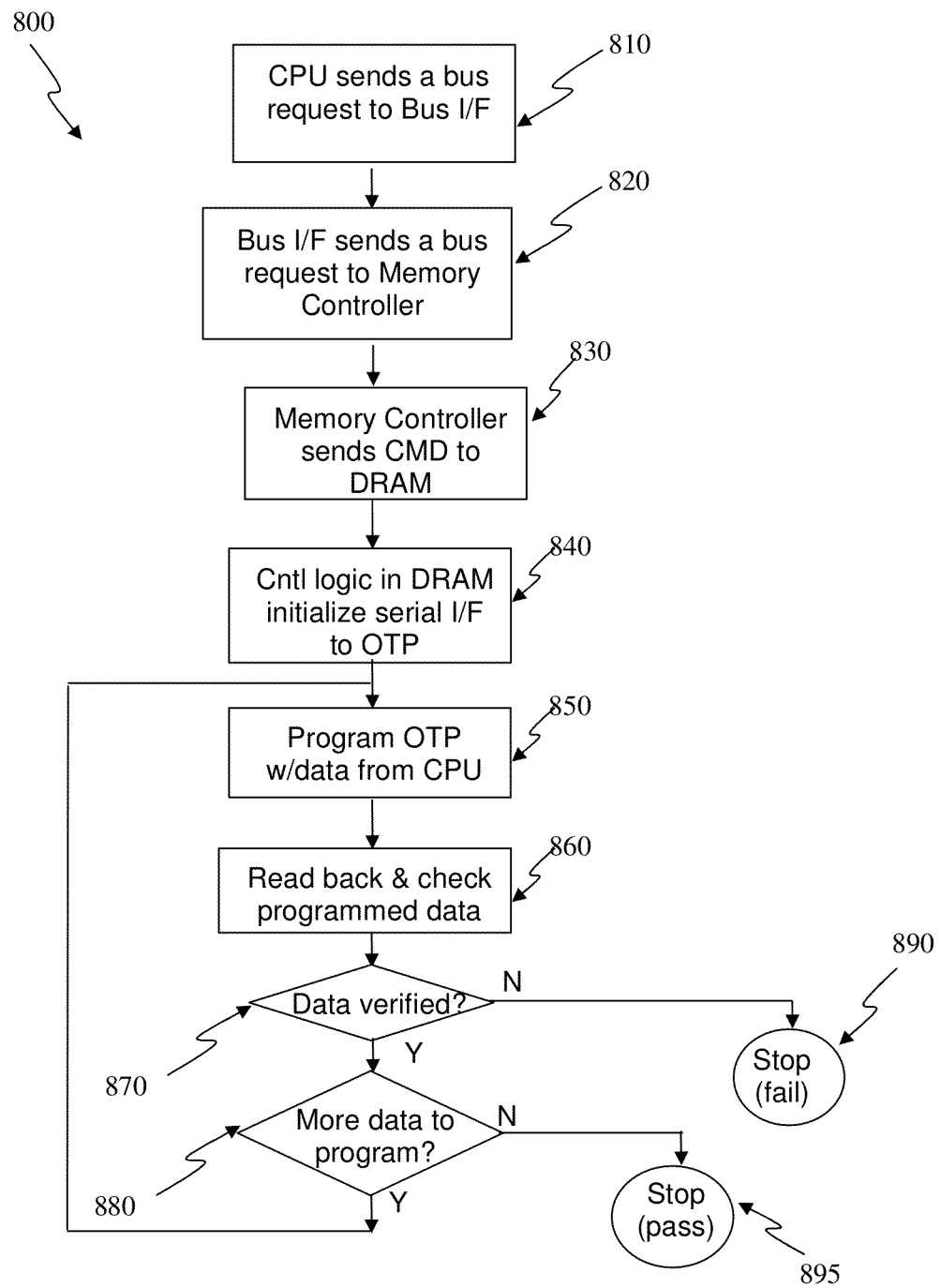
FIG. 16 depicts a method in a flow chart to program defect addresses or update parameters into memories in a 3D IC for repair or configuration according to one embodiment.

FIG. 16 shows a flow chart 800 depicting a method for programming data into an OTP memory in a 3D IC, according to one embodiment. The procedure starts at 810 for an embedded CPU to send a bus request to a Bus Interface Unit. The Bus Interface Unit then sends a request to a memory controller in step 820 in response to CPU's request. The memory controller sends commands (i.e. combinations of control signals such as WE\, CAS\, RAS\, CKE in SDRAM) to the memory dies in the 3D IC in step 830. The command can be any combination of control signals or any states in a state machine normally not used before. Alternatively, the memory controller can set a bit in a special register (i.e. Mode Register) in the memory dies in the 3D IC. Once receiving the commands from the memory controller, a control logic in the memory die (e.g., DRAM) can generate signals with proper timing to initialize serial interface to program the OTP memory into at least one dies in the 3D IC accordingly in step 840. Programming OTP memory starts in step 850 with the data sent from CPU. After programming is done, the memory controller reads back the data in OTP memory and checks with the original data sent in step 860. The data are verified in step 870 to determine if they are the same as expected. If not successfully verified, repair stops with a failure in step 890. If successfully verified, then check if there are more data to be programmed into at least one OTP memory in the 3D IC in 880. If there is no more data to program, repair stops with a pass in step 895. If there is more data to program, go back to step 850 to program more data sent from CPU. Programming data into the OTP memory in step 850 can start with loading data into the OTP memory temporary for further testing and then be followed by programming data into the OTP memory permanently in another embodiment.

Figure 17:
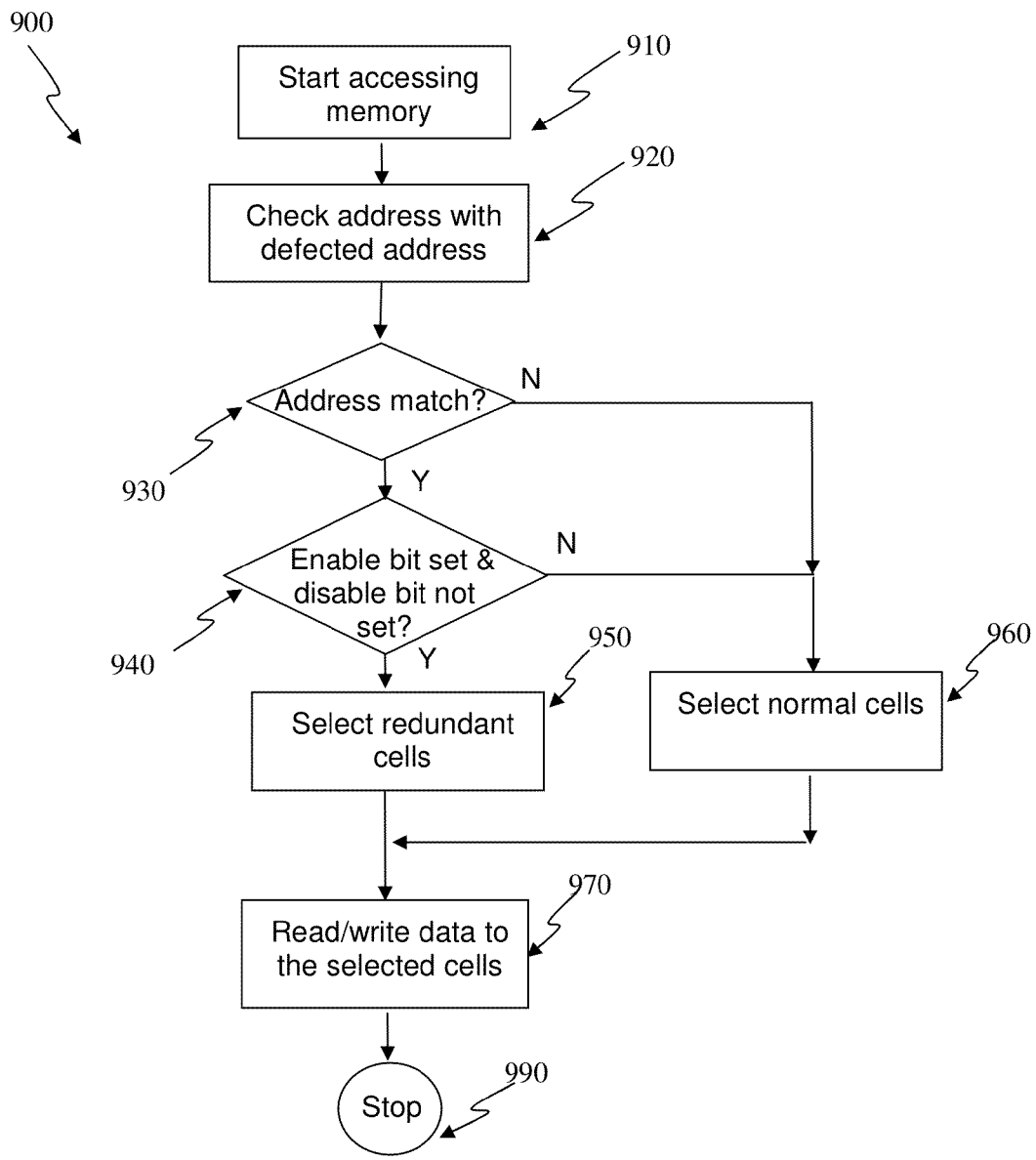
FIG. 17 depicts a method in a flow chart to access a memory after in-situ memory repair and configuration.

FIG. 17 shows a flow chart 900 depicting a method for accessing data in a memory in a 3D IC after being repaired or configured in-system, according to one embodiment. The procedure starts at 910 to generate an address to access the memory in a 3D IC. The address is checked at step 920 against defective addresses stored in the OTP memory to determine whether there is a match in step 930. If there is not a match, normal memory cell(s) are accessed in step 960. If there is a match, determine if the enable bit of the defective address is set and disable bit, if any, is not set in step 940. A disable bit is designated to invalidate an address and/or overwrite the enable bit. If determined that the enable bit for the defective address is not set (unless the disable bit is also set), then select the normal cell(s) in step 960. If determined that the disable bit for the defective address is set, select the normal cell(s) in step 960 though the enable bit for the defective address is set. On the other hand, if determined that the enable bit of the defective address is set and the disable bit, if any, is not set, select redundant cell(s) in step 950 instead. Then, read or write the selected cells in step 970, and stop in step 990 for the next access cycles.

The in-system repair scheme showed in FIGS. 14, 15(a), 15(b), 16, and 17 is for illustrative purpose only. The repair can be performed for memory dies, logic dies, analog dies or MEMS dies, for defect repair, device timing, parameter storage, feature select, die identification, security key, inventory control, or configuration settings, etc. in at least one die in a 3D IC. The OTP can be physically distributed into at least one die or a centralized OTP for all dies stacked in a 3D IC. The OTPs in the 3D IC can be coupled by low-pin-count interface in at least one die and then coupled together into a set of low-pin-count interface externally for the entire 3D IC. The desirable interfaces can be I2C-like, or SPI-like of serial interface. It is more desirable that the pins in the at least one LPC OTP are between 2-5 pins. There are many variations and equivalent embodiments and that are still within the scope of this invention for those skilled in the art.

To further reduce the footprint of each die in a 3D IC, the LPC NVM memory can be built under the bonding pad of PGM in the so-called Circuit-Under-Pad (CUP) technology. The CLK pin can also be shared with any clock signal of the other blocks in the same die and/or with a clock signal of the other dies in the same 3D IC. The Electrostatic Discharge (ESD) protection can be integrated into the one-pin NVM as well. The output driver of a bi-directional I/O can act as ESD protection for the external pin PGM.

The nonvolatile memory (NVM) discussed in this invention can be a One-Time Programmable (OTP), multiple-time programmable (MTP), charge-based NVM such as EPROM, EEPROM, or flash, or emerging memories such as PCRAM (Phase-Change RAM), MRAM (Magnetic RAM), or RRAM (Resistive RAM), etc. They all have the characteristics of retaining data when power supply is cutoff once they are programmable.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An integrated circuit, comprising:
a plurality of integrated circuit dies arranged in a stack, at least one of the integrated circuit dies having at least one low-pin-count (LPC) One-Time-Programmable (OTP) memory; and
interface pins of the at least one low-pin-count OTP memory in the at least one of the integrated circuit dies being coupled to a set of low-pin-count pins that are externally accessible to the at least one the integrated circuit dies,
wherein the at least one of the integrated circuit dies in the integrated circuit are configured to be selectable and configured to be readable or programmable using the set of the low-pin-count pins.

2. An integrated circuit as recited in claim 1, wherein the integrated circuit has at least one substrate.

3. An integrated circuit as recited in claim 1, wherein the integrated circuit has at least one Through Silicon Via (TSV) between at least two of the integrated circuit dies or between at least one of the integrated circuit dies and a substrate.

4. An integrated circuit as recited in claim 1, wherein the at least one integrated circuit die has a unique ID to be selected for access.

5. An integrated circuit as recited in claim 1, wherein the at least one low-pin-count OTP memory has no more than five (5) signal pins.

6. An integrated circuit as recited in claim 1, wherein at least one of the interface pins of the at least one low-pin-count OTP memory is coupled by at least one Through Silicon Via (TSV).

7. An integrated circuit as recited in claim 1, wherein the at least one low-pin-count OTP memory is coupled by a boundary scan into a set of low-pin-count signals for the integrated circuit that are externally accessible.

8. An integrated circuit as recited in claim 1, wherein the interface pins of the at least one low-pin-count OTP memory are coupled to a common bus.

9. An integrated circuit as recited in claim 8, wherein the interface pins of the at least one low-pin-count OTP memory are coupled by a wire-OR or an open-drain circuit.

10. An integrated circuit as recited in claim 1, wherein the interface pins of the at least one low-pin-count OTP memory have a serial input and/or a serial output.

11. An integrated circuit as recited in claim 10, wherein the interface pins of the at least one low-pin-count OTP memory are cascaded with at least another one of the low-pin-count OTP.

12. An integrated circuit as recited in claim 1, wherein data to be programmed into the at least one low-pin-count OTP memory is loaded with temporary data for testing before permanent programming.

13. An integrated circuit as recited in claim 1, wherein the interface pins have only two pins.

14. An integrated circuit as recited in claim 13, wherein at least one data transaction for the at least one low-pin-count OTP memory includes at least a device identifier.

15. An integrated circuit as recited in claim 1, wherein the interface pins have one Chip Select (CS) pin to enable the at least one low-pin-count OTP memory.

16. An integrated circuit as recited in claim 1, wherein the at least one low-pin-count OTP memory has a plurality of OTP cells, at least one of the OTP cells having an OTP element coupled to a program selector.

17. An integrated circuit as recited in claim 16, wherein the OTP element has at least one of silicide, silicided polysilicon or polysilicon.

18. An integrated circuit as recited in claim 16, wherein the OTP element has at least one of metal, metal alloy, or polymetal.

19. An integrated circuit as recited in claim 16, wherein the OTP element has at least one CMOS gate.

20. An integrated circuit as recited in claim 16, wherein the OTP element has at least one thermally isolated active region.

21. An integrated circuit as recited in claim 16, wherein the OTP element has at least one of the gate-oxide breakdown anti-fuse or contact/via anti-fuse.

22. An integrated circuit as recited in claim 16, wherein the program selector in at least one OTP cell is a MOS or a diode fabricated in standard CMOS logic processes.

* * * * *